United States Patent
Hendrix

(10) Patent No.: US 6,348,705 B1
(45) Date of Patent: Feb. 19, 2002

(54) LOW TEMPERATURE PROCESS FOR HIGH DENSITY THIN FILM INTEGRATED CAPACITORS AND AMORPHOUSLY FRUSTRATED FERROELECTRIC MATERIALS THEREFOR

(75) Inventor: Bryan C. Hendrix, Danbury, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/469,700

(22) Filed: Dec. 22, 1999

(51) Int. Cl.$^7$ .............................................. H01L 29/76
(52) U.S. Cl. ........................ 257/295; 257/310; 438/3; 427/126.3
(58) Field of Search ................................ 257/295, 310; 438/3; 427/126.3, 376.2; 501/134

(56) References Cited

U.S. PATENT DOCUMENTS

| | | | |
|---|---|---|---|
| 5,204,314 A | | 4/1993 | Kirlin et al. ................. 505/447 |
| 5,225,561 A | | 7/1993 | Kirlin et al. ................. 546/256 |
| 5,280,012 A | | 1/1994 | Kirlin et al. ................. 505/447 |
| 5,342,648 A | * | 8/1994 | MacKenzie et al. ...... 427/126.3 |
| 5,453,494 A | | 9/1995 | Kirlin et al. .................. 534/15 |
| 5,481,490 A | * | 1/1996 | Watanabe et al. ........... 365/145 |
| 5,536,323 A | | 7/1996 | Kirlin et al. ................. 118/726 |
| 5,677,002 A | | 10/1997 | Kirlin et al. ............. 427/248.1 |
| 5,820,664 A | | 10/1998 | Gardiner et al. ........ 106/287.17 |
| 5,859,274 A | | 1/1999 | Baum et al. ................... 556/76 |
| 5,916,359 A | | 6/1999 | Baum et al. ........... 106/287.18 |
| 5,919,522 A | | 7/1999 | Stauf et al. .............. 427/248.1 |
| 5,925,183 A | * | 7/1999 | Kato et al. ............. 106/287.18 |
| 5,932,905 A | | 8/1999 | O'Bryan, Jr. et al. ........ 257/298 |
| 6,063,639 A | * | 5/2000 | Kim et al. ....................... 438/3 |
| 6,080,593 A | * | 6/2000 | Kim et al. ....................... 438/3 |
| 6,180,420 B1 | * | 1/2001 | Hintermaier et al. .......... 438/3 |
| 6,180,482 B1 | * | 1/2001 | Kang ........................... 438/396 |

FOREIGN PATENT DOCUMENTS

JP    4-05-013676    * 1/1993    ........... H01L/27/04

OTHER PUBLICATIONS

IBM Technical Disclsoure Bulletin, Amorphous Dielectric Films of BaTiO(3) and Related Materials, Nov. 1999.*

Lahiry et al., Dielectric Properties of Sol–Gel Derived Barium–Strontium Titanate (Ba0.4Sr0.5TiO3) thin films, IEEE, pp. 129–132, 1998.*

Bartic et al., Quantitative Determination of the Dielectric Constant of the Interfacial Layer in PZT Ferroelectric Capacitors, IEEE, pp. 73–76, 1998.*

Zhu et al., Amorphous ferroelectric (Ba0.67Sr0.33)Ti1.0203 thin films with enhanced H2 induced interfacial polarization potential, Jour. App. Phys., vol. 84, No. 9, pp. 5134–5139, Nov. 1998.*

Gan, J.–Y. et al., "Dielectric property of $(TiO_2)_x$–$(Ta_2O_5)_{1-x}$ thin films," Appl. Phys. Lett. 72 (3), p. 332 Jan. 19, 1998.

Alers, G. B. et al., "Nitrogen plasma annealing for low temperature $Ta_2O_5$ films" Appl. Phys. Lett. 72 (11), p. 1308, Mar. 16, 1998.

Kirlin et al., "MOCVD of BaSrTiO3 for ULSI DRAMS", Integrated Ferroelectrics vol. 7, p. 307, 1995.

Van Dover, R.B., "Amorphous lanthanide–doped $TiO_x$ dielectric films", Appl. Phys. Lett. 74 (20) p. 3041, May 17, 1999.

Roy, P. K., et al., "Stacked high–∈ gate dielectric for giga–scale integration of metal–oxide–semiconductor technologies" Appl. Phys. Lett. 72 (22) p. 2835, Jun. 1, 1998.

Van Dover, R.B. et al., "Discovery of a useful thin–film dielectric using a composition–spread approach", Nature, vol. 392, Mar. 12, 1998, p. 162.

Nomura, Koji et al., "Electrical properties of $Al_2O_3$–$Ta_2O_5$ composite dielectric thin films prepared by RF reactive sputtering", Solid State Tech., Apr. 1997, p. 922.

Alers, G.B. et al., "Advanced amorphous dielectrics for embedded capacitors", IEDM, 99–797, p. 33.3.1.

Kawano, H., et al, "Effects of crystallization on structural and dielectric properties of thin amorphous films of $(1-x)BaTiO_3$–$xSrTiO_3$ (x=0–0.5, 1.0)," J. Appl. Phys., 73 (10), May 15, 1993, p. 5141.

Van Dover, R.B. et al., "Advanced dielectrics for gate oxide, DRAM and rf capacitors", IDEM 98–823, p 30.6.1.

* cited by examiner

*Primary Examiner*—Eddie Lee
*Assistant Examiner*—George C. Eckert, II
(74) *Attorney, Agent, or Firm*—Oliver A. Zitzmann; Marianne Fuierer; Robert McLauchlan

(57) ABSTRACT

A fully amorphous thin film material that is related to ferroelectric compositions which is grown at low temperature, e.g., below 400° C., to yield a material with voltage independent capacitance, capacitance density of from about 1000 to about 10000 $nF/cm^2$, leakage of $<10^{-7}$ $A/cm^2$, root mean square roughness <1 nanometer independent of film thickness, and an inverse capacitance that scales as a ratio of film thickness, reflecting uniform dielectric constant throughout the film. The film material may be employed for various capacitor structures, including decoupling capacitors, DRAM storage capacitors, feedthrough capacitors, bypass capacitors, capacitors for RC filters and capacitors for switched capacitor filters.

78 Claims, 13 Drawing Sheets

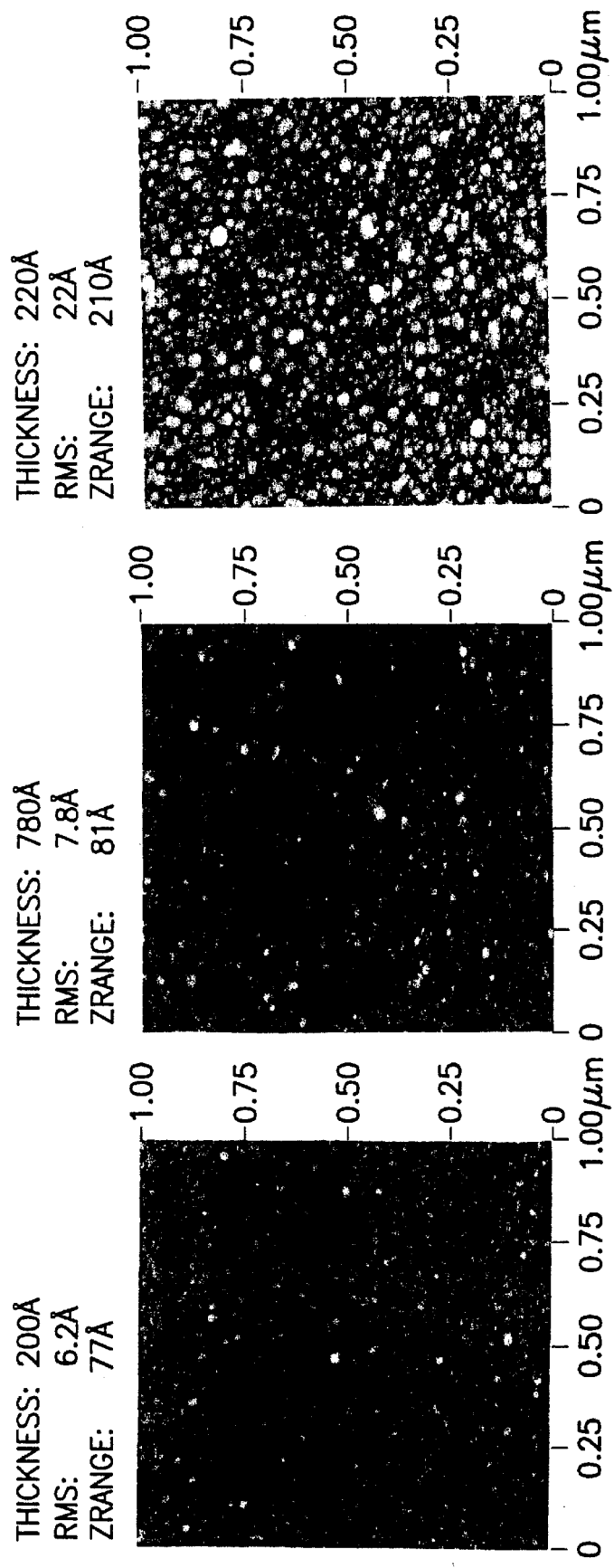

LOW TEMPERATURE PROCESS FOR HIGH DENSITY THIN FILM INTEGRATED CAPACITORS AND AMORPHOUSLY FRUSTRATED FERROELECTRIC MATERIALS THEREFOR

BACKGROUND OF THE INVENTION

1. Field of the Invention

This invention relates to formation of high dielectric constant capacitor structures comprising amorphously frustrated ferroelectric materials deposited by metalorganic chemical vapor deposition (MOCVD).

2. Description of the Related Art

In recent years, ferroelectric materials such as $Pb(Zr,Ti)O_3$ and $SrBi_2Ta_2O_9$ have been the focus of widespread interest as components of non-volatile memory devices. Non-volatile ferroelectric memory devices effect information storage by polarization of a thin ferroelectric material layer disposed between two plates of a capacitor structure. Each such ferroelectric capacitor is connected to a transistor to form a storage cell, in which the transistor controls the access of the read-out electronics to the capacitor. The transistor therefore is connected to bit-line and word-line elements, to constitute the storage cell.

The ferroelectric material may be utilized in a stacked capacitor structure that overlies the top of the transistor. The transistor drain (e.g., of a MOSFET structure) is connected to the bottom electrode of the capacitor by a plug formed of a suitable material such as polysilicon or tungsten.

Information subsequently can be changed in the ferroelectric memory cell by applying an electric field to the thin ferroelectric material layer to reverse ("flip") the polarization characteristic of the ferroelectric material. Ferroelectric memories (FRAMs), in contrast to dynamic random access memories (DRAMs), have the advantages of retaining stored information in the event of termination of the power supply, and do not require refresh cycles.

In such memory applications, ferroelectric materials desirably have the following electrical properties: (1) a low coercive field characteristic, facilitating use of a low voltage power supply; (2) a high remanent polarization characteristic, ensuring highly reliable information storage; (3) absence of significant fatigue or life-time deterioration characteristics; (4) absence of any imprint which would alter the stored information (e.g., leading to a preference of a certain polarization such as a logical "1" over a logical "0" character) or otherwise impair the ability to "read" the stored information; and (5) extended retention time, for reliable data storage over an extended period of time.

The foregoing electrical property criteria are satisfied in the layered pseudo-perovskite or "Aurivillius" phase of materials such as strontium bismuth tantalate, $SrBi_2Ta_2O_9$, sometimes hereinafter referred to as "SBT." As a result of these favorable characteristics, significant efforts have been initiated to integrate SBT in memory devices.

Ferroelectric capacitor structures utilizing SBT as the ferroelectric material have been made in the prior art by sol-gel techniques and demonstrate superior electrical properties. Nonetheless, the sol-gel methodology of forming ferroelectric thin films for this application permits only a low integration density to be achieved. Some improvement in the sol-gel methodology may be gained by mist or electrospray methods, permitting fabrication of memories up to 4 megabit in capacity. To achieve higher integration density of ferroelectric thin films of materials such as $Pb(Zr,Ti)O_3$ (PZT) and $SrBi_2Ta_2O_9$ (SBT) with smaller structure sizes (e.g., having a minimal feature size below about 0.7 micron), it is necessary to utilize chemical vapor deposition (CVD) processes, since CVD affords better conformality and step coverage than layers produced by any other deposition method. Further, the CVD process yields deposited films having high film uniformity and high film density, with the capability to grow very thin films at high throughput and low cost.

The art continues to seek improvement in high dielectric constant materials for thin film capacitor structures and ferroelectric memory applications, and in improved processes for the formation of such materials, as for example CVD processes for the deposition of bismuth oxide materials (e.g., $SrBi_2Ta_2O_9$, $Bi_4Ti_3O_{12}$, etc).

Among dielectric materials, thin film "frustrated ferroelectrics" or "superparaelectrics" such as $(Ba,Sr)TiO_3$ (BST) have extremely high dielectric constants. Such materials are ferroelectric in bulk form, but are paraelectric in thin film form. The mechanism of "frustrating" or suppressing the ferroelectric switching in these films is a field of current research, however, the resulting capacitor structures have high capacitance, large changes in capacitance with bias voltage, and low loss. These materials continue to be developed for high-density DRAM devices and high frequency tunable devices.

The aforementioned paraelectric thin film materials are deposited by MOCVD at temperatures above 500° C., which however is too high for many backend processes used in semiconductor processing. These paraelectric thin films also exhibit large changes in dielectric constant with bias voltage, a property quite useful for making tunable devices, but not for other applications where stable capacitance is desired. The dielectric constant also changes significantly with changes in temperature.

Taken against the background of the above-discussed state of the art, there is a continued need for improved low temperature, high dielectric constant capacitors.

SUMMARY OF THE INVENTION

The present invention relates in one aspect to an amorphous metal oxide thin film material of a composition that is ferroelectric in both crystalline thin film and crystalline bulk forms. The material comprises the elements of the corresponding ferroelectric composition, and has a same stoichiometry as the ferroelectric material.

The invention also contemplates amorphous metal oxide thin film materials compositionally related to such ferroelectric compositions, but which are "away from" the ferroelectric material, i.e., off-stoichiometric in relation thereto. Such "away from" ferroelectric compositions may for example, in the case of SBT, have metal site ratios of from about 0 to 20% Sr, 5 to 70% Bi and 10 to 95% tantalum or 0 to 10% strontium, 5 to 55% bismuth and 35 to 95% tantalum or 0 to 5% strontium, 15 to 50% bismuth and 45 to 85% tantalum.

The optimum composition for such amorphous dielectric film contains the elements of the bulk ferroelectric with a stoichiometry that is significantly away from the optimum ferroelectric stoichiometry. This same behavior has been observed in the case of Ba—Sr—Ti—O as described in U.S. Pat. No. 5,932,905, wherein compositions from 65–90% Ti on the metal site produced the best combination of capacitance, leakage, and linearity. Such phenomena is general and for each ferroelectric composition herein aforementioned, a highly favorable amorphous dielectric composition is located nearby.

Thin film amorphous materials of the invention have a voltage independent capacitance, a capacitance density in the range of from about 1000 to about 10000 nF/cm$^2$, and a current leakage of <10$^{-7}$ A/cm$^2$.

Another aspect of the invention relates to a thin film capacitor microelectronic device structure, comprising:

a first electrode;

a dielectric material selected from the group consisting of amorphous metal oxide thin film materials of a composition that is ferroelectric in both crystalline thin film and crystalline bulk forms, and amorphous metal oxide thin film materials related to ferroelectric compositions but deviating from the stoichiometry of the ferroelectric material, wherein the dielectric material in thin film amorphous form has a voltage independent capacitance, a capacitance density in the range of from about 1000 to about 10000 nF/cm$^2$, and a current leakage of <10$^{-7}$ A/cm$^2$; and a second electrode.

A still further aspect of the invention relates to a method of forming a thin film capacitor structure on a substrate, comprising:

forming a first electrode on the substrate;

depositing on the first electrode a dielectric material selected from the group consisting of amorphous metal oxide thin film materials of a composition that is ferroelectric in both crystalline thin film and crystalline bulk forms, and amorphous metal oxide thin film materials related to ferroelectric compositions but deviating from the stoichiometry of the ferroelectric material, wherein the dielectric material in thin film amorphous form has a voltage independent capacitance, a capacitance density in the range of from about 1000 to about 10000 nF/cm$^2$, and a current leakage of <10$^{-7}$ A/cm$^2$, and forming a second electrode on the layer of amorphous metal oxide thin film material.

Other objects, features and advantages of the invention will be more fully apparent from the ensuing disclosure and appended claims.

As used herein, the term "thin film" means a material layer thickness below 10,000 nanometers.

The term "high k" as used herein means a dielectric constant above 30.

BRIEF DESCRIPTION OF THE DRAWINGS

FIGS. 13 and 14 show atomic force microscopy (AFM) scans over 1×1 micrometer areas for films grown at 353° C.

FIG. 15 shows atomic force microscopy (AFM) scans over 1×1 micrometer areas for films grown at 388° C.

DETAILED DESCRIPTION OF THE INVENTION, AND PREFERRED EMBODIMENTS THEREOF

Figure 1:
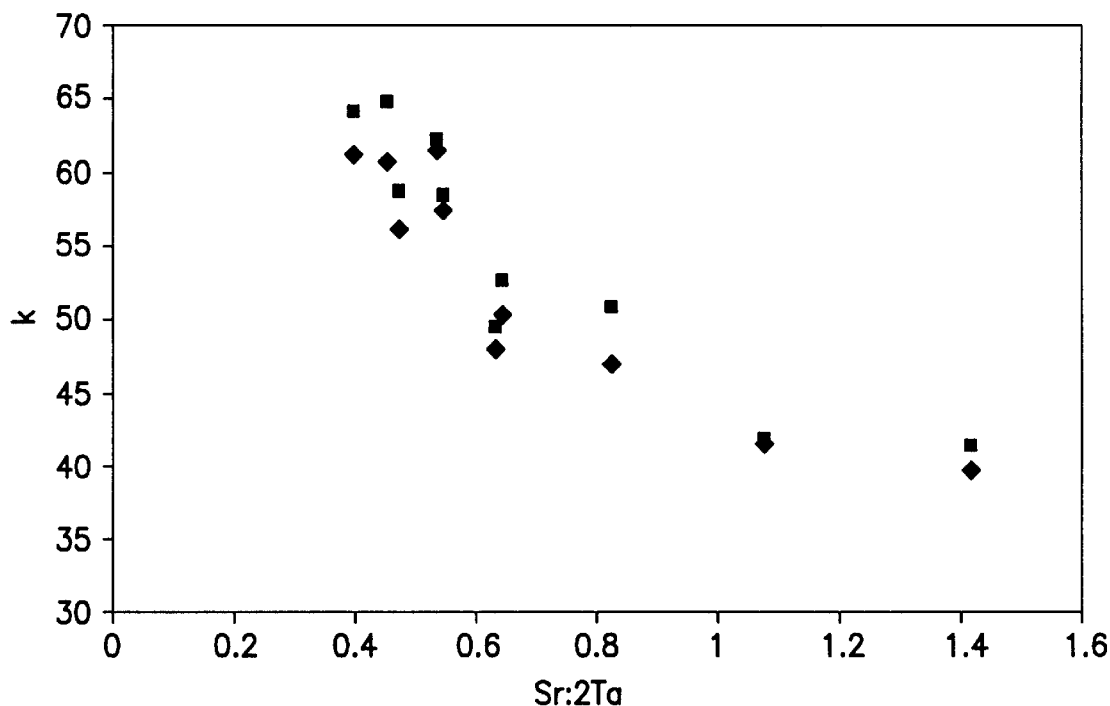
FIG. 1 is a graph of relative dielectric constant as a function of strontium content (Sr:2Ta) in films of strontium bismuth tantalate.

The disclosures of the following United States patents and patent applications are hereby incorporated herein by reference in their entireties:

U.S. Pat. application Ser. No. 08/835,768 filed Apr. 8, 1997 in the names of Thomas H. Baum, et al. now issued as U.S. Pat. No. 5,919,522;

U.S. Pat. application Ser. No. 08/484,654 filed Jun. 7, 1995 in the names of Robin A. Gardiner et al.;

U.S. Pat. application Ser. No. 08/414,504 filed Mar. 31, 1995 in the names of Robin A. Gardiner et al., now issued as U.S. Pat. No. 5,820,664;

U.S. Pat. application Ser. No. 08/280,143 filed Jul. 25, 1994, in the names of Peter S. Kirlin, et al. now issued as U.S. Pat. No. 5,536,323;

U.S. Pat. application Ser. No. 07/927,134, filed Aug. 7, 1992 in the same names;

U.S. Pat. application Ser. No. 07/807,807, filed Dec. 13, 1991 in the names of Peter S. Kirlin, et al., now issued as U.S. Pat. No. 5,204,314;

U.S. Pat. application Ser. No. 08/181,800 filed Jan. 15, 1994 in the names of Peter S. Kirlin, et al., and issued as U.S. Pat. No. 5,453,494;

U.S. Pat. application Ser. No. 07/918,141 filed Jul. 22, 1992 in the names of Peter S. Kirlin, et al., and issued Jan. 18, 1994 as U.S. Pat. No. 5,280,012;

U.S. Pat. application Ser. No. 07/615,303 filed Nov. 19, 1990 in the names of Peter S. Kirlin, et al.;

U.S. Pat. application Ser. No. 07/581,631 filed Sep. 12, 1990 in the names of Peter S. Kirlin, et al., and issued Jul. 6, 1993 as U.S. Pat. No. 5,225,561;

U.S. Pat. application Ser. No. 07/549,389 filed Jul. 6, 1990 in the names of Peter S. Kirlin, et al.;

U.S. Pat. application Ser. No. 08/975,372 filed Nov. 20, 1997 in the names of Thomas H. Baum, et al., now issued as U.S. Pat. No. 5,916,359;

U.S. Pat. application Ser. No. 08/960,915 filed Oct. 30, 1997 in the names of Thomas H. Baum, et al., now issued as U.S. Pat. No. 5,859,274;

U.S. Pat. application Ser. No. 08/976,087 filed Nov. 20, 1997 in the names of Frank S. Hintermaier, et al.;

U.S. Pat. application Ser. No. 09/440,235 filed Nov. 15, 1999 in the names of Bryan C. Hendrix, et al.;

U.S. Pat. application Ser. No. 09/441,694 filed Nov. 16, 1999 in the names of Bryan C. Hendrix, et al. and U.S. Pat. application Ser. No. 08/979,684 filed Nov. 26, 1997 in the names of Jeffrey R. Roeder, et al., now issued as U.S. Pat. No. 5,932,905.

The present invention is based on the discovery that both low processing temperature and voltage independent capacitance can be obtained by growing fully amorphous material at a composition that is ferroelectric in both crystalline thin film and crystalline bulk forms. Similar and selectively enhanced behavior can be obtained at related compositions in the amorphous thin film form. The zero bias dielectric constant for such amorphously frustrated ferroelectric material is lower than the zero bias dielectric constant of the best crystalline frustrated ferroelectric material, but the zero bias dielectric constant is much higher than the zero bias dielectric constant of other common dielectrics.

As mentioned in the Background section hereof, a major drawback of high dielectric constant dielectrics that have been developed for the DRAM industry is that they require high processing temperatures, generally in excess of 500° C., which makes such materials unattractive for integrated passive applications.

The present invention contemplates a dielectric material with a capacitance density in the range of from about 1000 to about 10000 $nF/cm^2$, and a leakage of $<10^{-7}$ $A/cm^2$, formed by a process wherein all processing is carried out at temperature less than 400° C.

In accordance with the invention, an MOCVD process is conducted to produce high quality amorphous films with a root mean square (RMS) roughness of <1 nanometer, independent of film thickness. This should not be understood to exclude the amorphous film's use from trench, button and other three-dimensional structures that have been envisioned to increase the effective surface area of a capacitor.

In the product amorphous film material of the invention, the inverse capacitance scales as a ratio of film thickness, indicating uniform dielectric constant throughout the film. This characteristic is in marked contrast to crystalline high k films, which generally have decreasing effective dielectric constant with decreasing thickness. Also in contrast to crystalline high k films, the capacitance is largely independent of bias voltage, with less than 0.5% change from 0 to 250 kV/cm bias, and the capacitance is largely independent of temperature, with <10% change from ambient temperature (e.g., 25° C.) to 77° K.

The thin film materials produced in accordance with the invention are suitable for a wide variety of integrated passive systems.

The thin film materials of the invention may be of a widely varied type, including compositions that are highly ferroelectric or anti-ferroelectric in their bulk crystalline forms. Highly A-site ($ABO_3$) deficient materials may be employed for such purpose. More specifically, PbO or $Bi_2O_3$ additions to oxides of titanium, zirconium, hafnium, vanadium, niobium, tantalum, chromium, molybdenum, tungsten, etc., may be utilized to yield high k amorphous films. Particularly preferred high k amorphous film materials include barium titanate, strontium titanate, barium strontium titanate, strontium bismuth tantalate, bismuth titanate, lead zirconium titanate, and the like. Alloying of the amorphous film materials with La, Nb, Zr, Hf, W, and Ba may be employed to produce high k amorphous films.

A preferred contact material for capacitor structures fabricated in accordance with the present invention comprises iridium. To reduce roughening of the iridium structures during substrate heatup, the heatup may be carried out in the presence of an inert gas or a forming gas (e.g., $H_2$ or CO-based forming gas).

In one specific preferred embodiment of the invention, the amorphously frustrated ferroelectric material comprises a bismuth oxide material (e.g., $SrBi_2Ta_2O_9$, $Bi_4Ti_3O_{12}$, etc.), as grown by MOCVD to produce films that are substantially completely amorphous by x-ray diffraction (XRD) characterization.

In another specific preferred embodiment of the invention, the amorphously frustrated ferroelectric material comprises a $(Ba,Sr)TiO_3$ (BST) material, as grown by MOCYD to produce films that are substantially completely amorphous by x-ray diffraction (XRD) characterization.

The amorphous paraelectric films of the invention may be formed in any suitable manner, wherein the oxide film is deposited and subsequently processed at a temperature below about 500° C., and more preferably below about 400° C. Among possible deposition techniques are physical vapor deposition, sputtering, solution deposition, and assisted (plasma, x-ray, e-beam, etc.) and unassisted chemical vapor deposition.

The preferred deposition process is liquid delivery metalorganic chemical vapor deposition (liquid delivery MOCVD).

The liquid delivery MOCVD system for growing the oxide films of the invention may for example comprise a system of the type disclosed in U.S. Pat. No. 5,204,314 issued Apr. 20, 1993 to Peter S. Kirlin et al. and in U.S. Pat. No. 5,536,323 issued Jul. 16, 1996 to Peter S. Kirlin et al., which utilize heated vaporization structures such as microporous disk elements to effect high rate vaporization of the source reagent materials for the metal oxide film. In operation, liquid source reagent compositions are flowed onto the vaporization structure for flash vaporization. Vapor thereby is produced for transport to the deposition zone, e.g., the CVD reactor. The liquid delivery systems of these patents provide high efficiency generation of vapor from which films may be grown on substrates.

The precursor vapor formed by the high rate vaporization apparatus is transported to a chemical vapor deposition zone containing a substrate, e.g., a wafer provided on a heated susceptor. Upon contacting of the precursor vapor with the wafer, the metal components of the vapor are deposited on the wafer surface. The vapor may be delivered in the chemical vapor deposition chamber by a disperser such as a showerhead or nozzle, to provide a uniform flux of the vapor across the width of the wafer, to yield a correspondingly uniform thickness of deposited metal-containing film on the wafer. The process conditions (temperature, pressure, flow rate and composition of the vapor) may be suitably controlled to ensure an optimum process result for the specific MOCVD operation being conducted in the process system.

The low temperature process of the invention provides an economic and efficient method for forming thin film capacitors suitable for integration with circuitry on an IC chip. The integrated capacitors formed by such process may be employed in DRAM storage capacitors, feedthrough capacitors, bypass capacitors, decoupling capacitors, capacitors for RC filters, and capacitors for switched capacitor filters. Thin film capacitors in accordance with the invention may be formed of $Ba_{1-x}Sr_xTiO_3$ or other perovskites having the composition $ABO_3$, where A and B are crystallographically inequivalent, or non-perovskite dielectric materials such as $Ba_2Ti_9O_{20}$.

The capacitor structures of the invention may thus be embodied in an article (e.g., an integrated circuit chip) that comprises the thin film capacitor disposed on a substrate, wherein the capacitor comprises a first and a second electrode, with a thin film of oxide dielectric material disposed between the electrodes.

The oxide dielectric material may for example comprise a Ba—Sr—Ti-oxide, with at least 40 atom % and preferably at least 60 atom % (of the total metal content) being Ti. As a specific embodiment, the oxide may have a nominal composition $(Ba_xSr_yTi_{1-x-y})$-oxide, with 1−x−y in the range 0.65–0.90, and with both x and y greater than or equal to 0.05.

The present invention is also embodied in a method of making an article including an integrated capacitor (i.e., a thin film capacitor) that comprises providing a substrate, forming a first electrode on the substrate, and depositing on the first electrode a layer of the amorphous frustrated ferroelectric material, such as for example the aforementioned Ba—Sr—Ti-oxide. After attainment of the desired oxide thickness a second electrode is formed on the oxide.

In one specific embodiment, the oxide deposition conditions include temperature below 500° C., to deposit an oxide having a nominal composition $(Ba_xSr_yTi_{1-y-x})$-oxide, with 1−x−y in the range 0.65–0.90, with both x and y greater than or equal to 0.05. Ba, Sr and Ti together typically comprise at least 99 atomic percent of the total metal content of such preferred dielectric material.

The oxygen content typically depends on the metal ion content and may exceed 60% of the total number of atoms of the material.

Titanate films in accordance with the invention may be deposited on Si substrates, typically with a sputter-deposited Pt bottom electrode on a $SiO_2$ barrier layer. Ta barriers also may be used, as another benefit of the low temperature character of the film formation process in the practice of the present invention.

Subsequent to bottom electrode deposition, the titanate amorphous film may be deposited by metal-organic chemical vapor deposition (MOCVD).

Suitable metal-organic source reagents for the aforementioned titanate films may include barium bis (2,2,6,6-tetramethyl-3,5-heptanedionate). Lewis base adduct (polyamine), or $Ba(thd)_2$(polyamine), as a barium source reagent, and strontium bis (2,2,6,6-tetramethyl-3,5-heptanedionate). Lewis base adduct (polyamine), or $Sr(thd)_2$(polyamine), as Group II metal source reagents, with titantium bis (isopropoxide) bis (2,2,6,6-tetramethyl-3,5-heptanedionate), or $Ti(OCH(CH_3)_2)_2(thd)_2$, as the titanium precursor. Other precursor compounds can be used if desired.

With the aforementioned source reagents, film growth can be carried out in an MOCVD reactor fitted with a liquid delivery system that injects the precursor compounds, dissolved in an organic solvent (e.g., n-butyl acetate polyamine), into a hot vaporizer, where they are flash vaporized into an argon carrier gas stream for transport to the reactor.

As a specific example, the amorphous metal oxide thin film materials of the invention may be formed by liquid delivery MOCVD using a solvent composition comprising toluene and a Lewis base, wherein toluene is present at a concentration of from about 75% to about 98% by volume, based on the total volume of toluene and the Lewis base, and one or more precursor species dissolved or suspended in the solvent composition.

As another specific example, liquid delivery MOCVD formation of an amorphous metal oxide thin film material according to the invention may be carried out using a solvent composition comprising tetrahydrofuran. The precursors used in the liquid delivery MOCVD process may include adducts and complexes of varying and suitable types. Particularly preferred precursor species of such types include Lewis base adducts of metal beta-diketonates such as for example $Bi(thd)_3$ Lewis base adducts.

The deposition reactor may be of any suitable type, e.g., a reactor designed for use with low vapor pressure precursors, and designed to give uniform films, e.g., over 6 inch diameter substrates. The reactor may be operated at suitable low pressure (e.g., 700 mTorr), with concurrent introduction of any suitable oxidant or oxidizer medium, e.g., a flow of oxygen and nitrous oxide. See, for instance, P. Kirlin et al., *Integrated Ferroelectrics*, Vol. 7, p. 307 (1995).

For the above-described system, employing a 500 sccm flow of each of oxygen and nitrous oxide, illustrative growth conditions may for example be as follows:

| Deposition Temperature | 350–500° C. |
|---|---|
| Reactor Pressure | 5 Torr |
| Deposition Rate | 3–4 nm/minute |
| Substrate | $Pt/SiO_2/Si$ |
| Ar Flow Rate | 200 sccm |
| $O_2$ Flow Rate | 500 sccm |
| $N_2O$ Flow Rate | 500 sccm |

As another illustrative example of a low temperature process conducted in accordance with the present invention to form a high k capacitor structure from an amorphously frustrated ferroelectric material, a bismuth oxide capacitor thin film may be formed on a substrate by a low temperature (<500° C.) process involving deposition of bismuth or bismuth oxide on a substrate by chemical vapor deposition from a precursor which is vaporized to form a precursor vapor which then is contacted with the substrate, wherein the bismuth precursor is a bismuth β-diketonate.

In the preferred practice of such process, the precursor for forming the bismuth-containing material on the substrate comprises an anhydrous mononuclear bismuth β-diketonate, although other bismuth β-diketonates may be employed, of the formula $BiA_xB_y$ wherein A=β-diketonate, B=another ligand which is compatible with the use of the composition as a precursor for formation of bismuth-containing material on a substrate, x=1,2 or 3, and y=3−x.

The composition and the synthesis of such bismuth tris (β-diketonate) precursors are more fully disclosed and claimed in U.S. Pat. No. 5,859,274 issued Jan. 12, 1999 in the names of Thomas H. Baum, Gautam Bhandari and Margaret Chappuis for "Anhydrous Mononuclear Tris (β-Diketonate) Bismuth Compositions for Deposition of Bismuth-Containing Films, and Method of Making the Same," the disclosure of which hereby is incorporated herein by reference in its entirety.

The β-diketonate ligand of such anhydrous mononuclear tris(β-diketonate) bismuth composition may be of any suitable type, including the illustrative β-diketonate ligand species set out in Table A below:

TABLE A

| Beta-diketonate ligand | Abbreviation |
| --- | --- |
| 2,2,6,6-tetramethyl-3,5-heptanedionato | thd |
| 1,1,1-trifluoro-2,4-pentanedionato | tfac |
| 1,1,1,5,5,5-hexafluoro-2,4-pentanedionato | hfac |
| 6,6,7,7,8,8,8-heptafluoro-2,2-dimethyl-3,5-octanedionato | fod |
| 2,2,7-trimethyl-3,5-octanedionato | tod |
| 1,1,1,5,5,6,6,7,7,7-decafluoro-2,4-heptanedionato | dfhd |
| 1,1,1-trifluoro-6-methyl-2,4-heptanedionato | tfmhd |

In such deposition of bismuth on a substrate for formation of SBT capacitor thin films, the use of the anhydrous mononuclear bismuth source material provides improved thermal transport and flash vaporization, and is better suited to the low temperature deposition process of the invention, in relation to the triphenylbismuth precursor conventionally employed by the prior art.

Although such mononuclear bismuth source material is highly preferred, dinuclear bismuth precursors, as well as mixtures of mononuclear and dinuclear bismuth source materials may likewise be usefully employed in the broad practice of the present invention.

An SBT film may be formed on a substrate by chemical vapor deposition from a wide variety of precursors for the strontium, bismuth and tantalum constituents, including the aforementioned bismuth precursor, viz., anhydrous mononuclear bismuth β-diketonate. The strontium and tantalum precursors may be of any suitable precursor types as source materials for such metal components, but strontium (2,2,6,6-tetramethyl-3,5-heptanedionato)$_2$(L), wherein the ligand L is tetraglyme or pentamethyldiethylenetriamine, is a preferred Sr precursor, and the tantalum precursor most preferably comprises Ta(OiPr)$_4$(2,2,6,6-tetramethyl-3,5-heptanedionate).

For liquid delivery, the above-discussed SBT precursors may be mixed with any suitable solvent medium, e.g., an 8:2:1 ratio mixture of tetrahydrofuran/isopropanol/tetraglyme, a 5:4:1 ratio mixture of octane, decane and pentamethyldiethylenetriamine, a 9:1 ratio mixture of tetrahydrofuran and pentamethyldiethylenetriamine or more preferably a 9:1 ratio mixture of toluene and pentamethyldiethylenetriamine, with the respective Sr, Bi and Ta precursors being individually stored (in solution) in separate reservoirs or supply vessels.

Prior to delivery, the three precursor solutions may be mixed in a liquid delivery system such as that disclosed in U.S. Pat. No. 5,204,314. The resulting precursor liquid mixture then may be vaporized at suitable temperature in the range of for example 150–240° C., optionally with argon or other carrier gas to transport the resulting multicomponent precursor vapor to the CVD reactor for contacting with the hot substrate. The carrier gas may be mixed with or initially contain oxygen or other oxidant gas.

The precursor vapor in the CVD reactor is contacted with the substrate, as for example a Pt/Ti/SiO$_2$/Si wafer at a temperature which for example may be on the order of 300–450° C., for sufficient time to permit film growth to occur to the desired extent.

The SBT film formed by such method comprises an amorphous film suitable for the fabrication of capacitor structures.

The solvent mixture of 8:2:1 tetrahydrofuran/isopropanol/tetraglyme described above is illustrative, and other solvent mixtures may be employed. A particularly preferred solvent mixture for the precursors is a 5:4:1 octane/decane/pentamethyldiethylenetriamine mixture.

A low temperature CVD process may be utilized in accordance with the present invention for formation of a wide variety of amorphous films, including films of SrBi$_2$Ta$_2$O$_9$, SrBi$_2$Ta$_{2-x}$Nb$_x$O$_9$ wherein x is a number between 0 and 2, SrBi$_2$Nb$_2$O$_9$, Sr$_{1-x}$Ba$_x$Bi$_2$Ta$_{2-y}$Nb$_y$O$_9$ wherein x is a number between 0 and 1 inclusive, and y is a number between 0 and 2 inclusive, Sr$_{1-x}$Ca$_x$Bi$_2$Ta$_{2-y}$Nb$_y$O$_9$ wherein x is a number between 0 and 1 inclusive and y is a number between 0 and 2 inclusive, Sr$_{1-x}$Pb$_x$Bi$_2$Ta$_{2-y}$Nb$_y$O$_9$ wherein x is a number between 0 and 1 inclusive and y is a number between 0 and 2 inclusive, and Sr$_{1-x-y-z}$Ba$_x$Ca$_y$Pb$_z$Bi$_2$Ta$_{2-p}$Nb$_p$O$_9$ wherein x is a number between 0 and 1 inclusive, y is a number between 0 and 1 inclusive, z is a number between 0 and 1 inclusive, and p is a number between 0 and 2 inclusive.

Bi-containing oxide films may also be formed in accordance with the invention, with substitution of one or more of the metal elements therein by a metal from the lanthanide series (e.g., La, Ce, Ho, Pr, Eu, Yb) or by doping of the film with a metal from the lanthanide series.

Bismuth titanate and related materials may also be formed by CVD using a (β-diketonate) bismuth precursor such as described hereinabove, to form a film having a composition selected from the following metal oxide formulae:

$Bi_4Ti_3O_{12}$ $PrBi_3Ti_3O_{12}$ $HoBi_3Ti_3O_{12}$ $LaBi_3Ti_3O_{12}$ $Bi_3TiTaO_9$ $Bi_3TiNbO_9$ $SrBi_4Ti_4O_{15}$ $CaBiTi_4O_{15}$ $BaBi_4Ti_4O_{15}$ $PbBi_4Ti_4O_{15}$ $Sr_{1-x-y-z}Ca_xBa_yPb_zBi_4Ti_4O_{15}(0<x<1,0<y<1,0<z<1)$ $Sr_2Bi_4Ti_5O_{18}$ $Ca_2Bi_4Ti_5O_{18}$ $Ba_2Bi_4Ti_5O_{18}$ $Pb_2Bi_4Ti_5O_{18}$ $Sr_{2-x-y-z}Ca_xBa_yPb_zBi_4Ti_5O_{18}$ $(0<x<2,0<y<2,0<z<2)$ $SrBi_5Ti_4FeO_{18}$ $CaBi_5Ti_4FeO_{18}$ $BaBi_5Ti_4FeO_{18}$ $PbBi_5Ti_4FeO_{18}$ $Sr_{1-x-y-z}Ca_xBa_yPb_zBi_5Ti_4FeO_{18}(0<x<1, <y<1, <z<1)$ $Bi_5Ti_3FeO_{15}$ $LaBi_4Ti_3FeO_{15}$ $PrBi_4Ti_3FeO_{15}$ $Bi_6Ti_3FeO_{18}$ $Bi_9Ti_3Fe_5O_{27}$ as well as films of such type wherein one of the metal constituents is replaced by a metal of the lanthanide series, or wherein the film is doped with a lanthanide series metal.

Other bismuth-containing oxide films that may be formed by CVD in accordance with the invention using a (β-diketonate) bismuth precursor include the following:

$Bi_2WO_6$ $BiMO_3(M=Fe, Mn)$ $Ba_2BiMO_6(M=V, Nb, Ta)$ $Pb_2BiMO_6(M=V, Nb, Ta)$ $Ba_3Bi_2MO_9(M=Mo, W)$ $Pb_3Bi_2MO_9(M=Mo, W)$ $Ba_6BiMO_{18}(M=Mo, W)$ $Pb_6BiMO_{18}(M=Mo, W)$ $KBiTi_2O_6$ $K_2BiNb_5O_{15}$

The various precursors employed in the CVD process of the present invention may be used in adducted form. Examples include (β-diketonate) strontium adducts wherein the adduct ligand may be a polyether (e.g., R—$(CH_2CH_2O)_n$—R' wherein n is a number between 2 and 6 inclusive, and each of R and R' are independently selected from H and alkyl), or a polyamine adduct, e.g., R—$(CH_2CH_2NR")_n$—R' wherein n is a number between 2 and 6 inclusive, and each of R, R' and R" are independently selected from hydrogen and alkyl. Alternative adducting ligand species include tetraglyme (=MeO—$(CH_2CH_2O)_4$—Me), triglyme (=MeO—$(CH_2CH_2O)_3$—Me), or amine adducting ligands such as N,N,N',N'-tetramethylethylenediamine, N,N,N',N", N"-pentamethyldiethylenetriamine (=$Me_2N$—$(CH_2CH_2NMe)_2$—Me) or N,N,N',N",N'",N'"-hexamethyltriethylenetetramine (=$Me_2N$—$(CH_2CH_2NMe)_3$—Me).

Bismuth- and tantalum-containing films may be formed by a CVD process in accordance with the present invention, wherein the tantalum precursor has the general formula $Ta(OR)_{5-n}(X)_n$ and wherein R is $C_1$–$C_5$ alkyl, X is β-diketonate, e.g., thd, with n being an integer of 1 to 5 inclusive. Tantalum precursors of such type are more fully described in U.S. Pat. No. 5,677,002 issued Oct. 14, 1997 in the names of Peter S. Kirlin, et al., the disclosure of which is hereby incorporated herein by reference in its entirety.

The precursors employed in the broad practice of the present invention may be used with any suitable solvents which are compatible with the precursors dissolved therein and which do not preclude the CVD process from being carried out to produce the desired film. Illustrative of potential solvents species which may be used in the broad practice of the present invention include hydrocarbon solvents, including aliphatic, cycloaliphatic and aromatic hydrocarbons as well as substituted hydrocarbons, e.g., alcohols, ethers, cyclic ethers, esters, amines, ketones, and aldehydes. The solvent may be employed as single species medium for the precursor, or solvent mixtures may be employed.

Examples include the aforementioned 8:2:1 by volume mixture of tetrahydrofuran, isopropanol and tetraglyme. Similar solvent mixtures with a polyamine in place of the aforementioned tetraglyme component may likewise be employed. Illustrative of such polyamines are N,N,N',N", N"-pentamethyldiethylenetriamine (=$Me_2N$—$(CH_2CH_2NMe)_2$—Me) and N,N,N',N",N'",N'"-hexamethyltriethylenetetramine (=$Me_2N$—$(CH_2CH_2NMe)_3$—Me)). Hydrocarbon solvents having a carbon number greater than 7 may be employed, such as octane, nonane, decane, undecane, dodecane, tridecane or tetradecane, or mixture thereof.

The CVD process of the present invention contemplates using various permutations of solvents and specific precursor species, including the provision of all precursors in a single solution as a "cocktail" mixture for liquid delivery vaporization and chemical vapor deposition, as well as utilizing single component, binary, ternary and other multicomponent solvent solutions. Single precursor solutions may be separately formulated and separately delivered to the liquid delivery system so that the precursor solutions are mixed before vaporization, or separate vaporizers may be employed for certain ones of multiple precursor solutions, with the resulting vapor being joined for passage to the CVD reactor.

The vapor produced by vaporization of the precursor may be mixed in the liquid delivery system with a carrier gas, which may comprise an inert gas such as argon, helium or nitrogen, and/or an oxidizer gas such as $O_2$, singlet $O_2$, ozone, $NO_x$ wherein x=1,2, or 3, hydrogen peroxide, oxygen plasma, $N_2O$, or combinations of two or more of the foregoing oxidizer species.

The vaporization of the liquid precursors may be carried out at any suitable process conditions, with lower temperatures on the order of 170–230° C. being most preferred.

The CVD process itself may be carried out in any suitable manner, optionally enhanced by physical or chemical techniques (e.g., plasma-assisted CVD, photoactivation CVD, etc.).

The CVD reactor may be maintained at any suitable process conditions, including suitable substrate temperatures for deposition, and gaseous oxidizer may be admixed to the precursor vapor either before or after entering the CV) reactor. The CVD reactor may be maintained at any suitable pressure level during the deposition process, e.g., a pressure in the range of 0.001–760 torr. Most preferably, the pressure is in a range of from about 0.1 to about 10 torr. Flow rate of precursor vapor and any added carrier gas may be at any suitable volumetric flow rate, e.g., 1–16,000 standard cubic centimeters per minute (sccm).

The deposition temperature for the deposition of bismuth preferably is effected at temperatures below about 450° C., it being recognized that the specific temperatures which are advantageously employed in accordance with the present invention for a given end use application may be readily determined by ordinary skilled artisans without undue experimentation.

Figure 2:
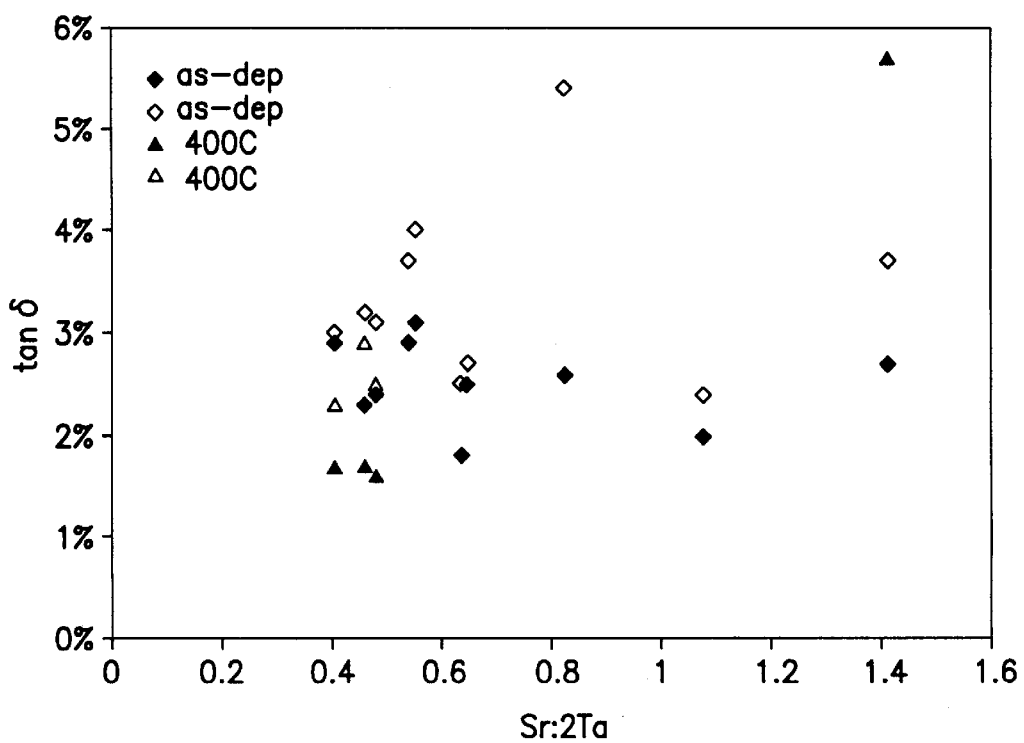
FIG. 2 is a graph of dielectric loss as a function of Sr:2Ta content for as-deposited films and films that were annealed for 1 hour at 400° C.

Referring now to the drawings, FIG. 1 is a graph of relative dielectric constant as a function of strontium content (Sr:2Ta) in films of amorphous strontium bismuth tantalate. FIG. 1 shows the as-deposited dielectric constants of the thin film material are between 40 and 65. Annealing at 400° C. for 1 hour made no significant change in dielectric constant of such SBT material. Annealing improves the dielectric loss for films with the best dielectric constant (low Sr content) as evidenced by the data in FIG. 2, which is a graph of dielectric loss as a function of the Sr:2Ta content for as-deposited SBT films (as shown by datum symbols ◆ and ◇) and for SBT films that were annealed for 1 hour at 400° C. (as shown by datum symbols ▲ and △).

Figure 3:
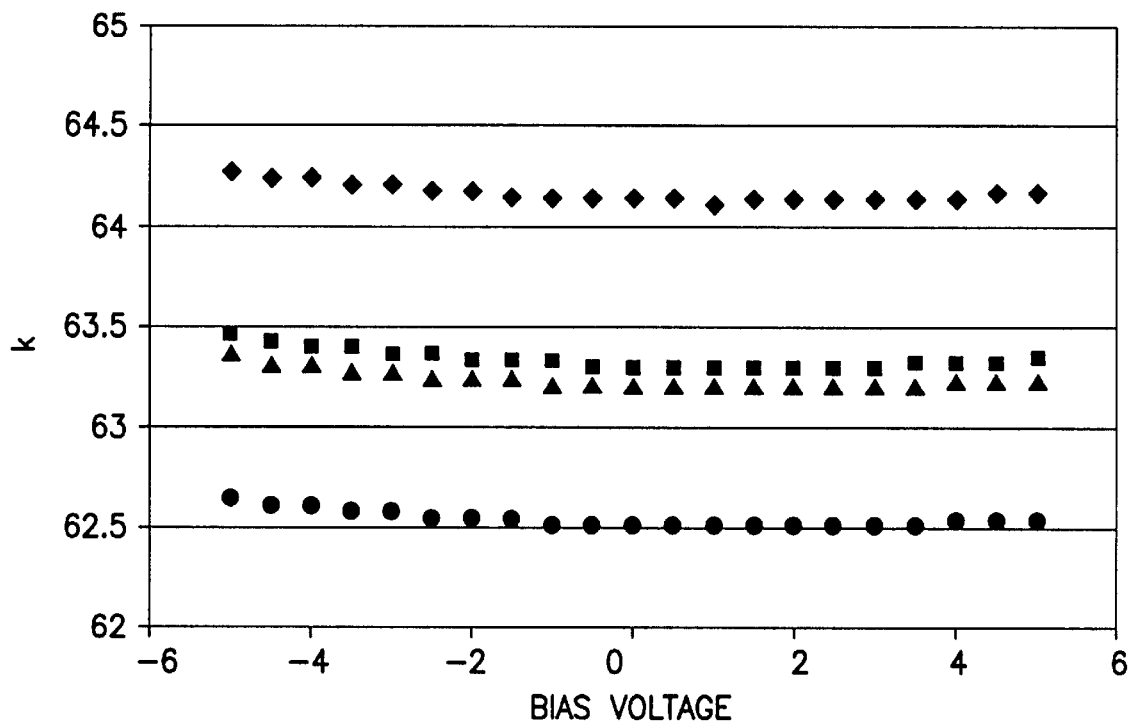
FIG. 3 is a graph of dielectric constant as a function of bias voltage for a film having a thickness of 189 nanometers thickness, with the composition $Sr_{0.40}Bi_{1.75}Ta_2O_x$ wherein x is from about 6 to about 10.

The voltage independent nature of the dielectric constant is shown for a series of capacitors in FIG. 3. FIG. 3 is a graph of dielectric constant as a function of bias voltage for a capacitor film having a thickness of 189 nanometers thickness, with the composition $Sr_{0.40}Bi_{1.75}Ta_2O_x$, wherein x is from about 6 to about 10. In all cases, the change was less than 0.1% V. Variations from capacitor to capacitor were within the accuracy of the top electrode area measurement for the data shown in FIG. 3.

Figure 4:
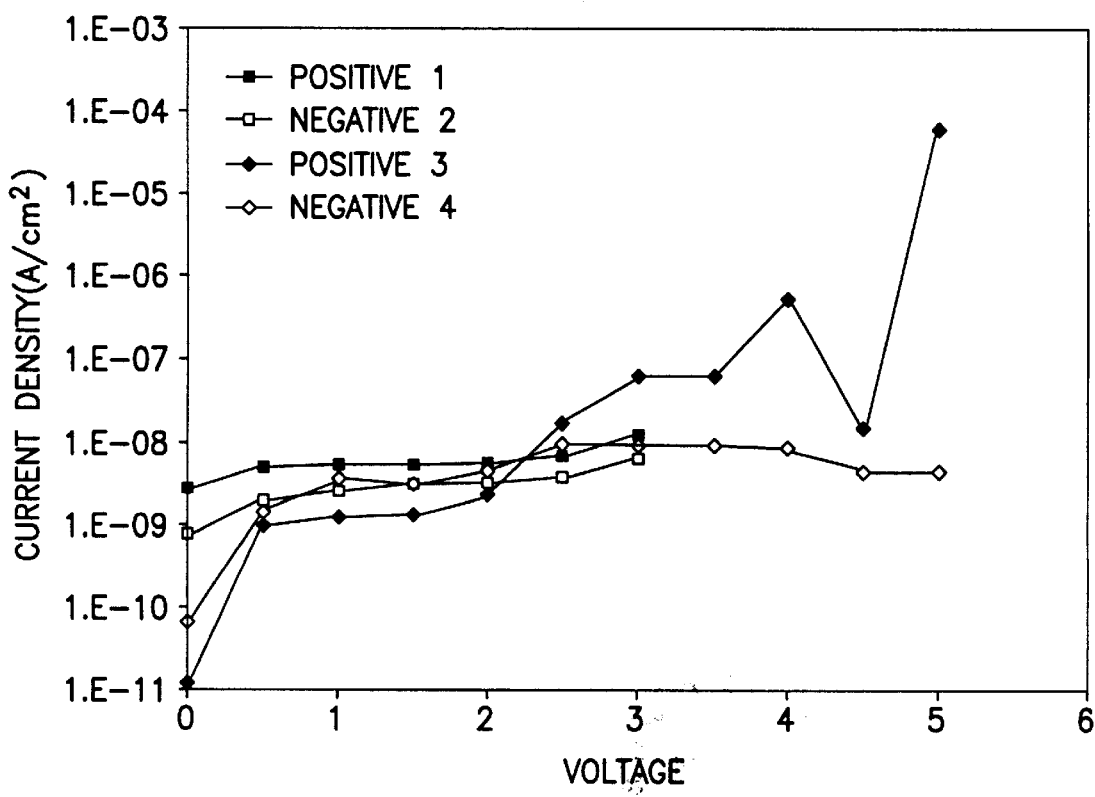
FIG. 4 is a graph of leakage current density as a function of voltage for a series of scans, in which the current was allowed to relax for 10 seconds at each voltage before measuring the next voltage.

Leakage of these SBT films was $<10^{-8} A/cm^2$ for biases less than 2 volts, as shown in FIG. 4. FIG. 4 is a graph of leakage current density, in $A/cm^2$, as a function of voltage, for a series of scans, in which the current was allowed to relax for 10 seconds at each voltage before measuring the next voltage.

Similar behavioral characteristics are exhibited by a wide range of amorphous ferroelectric compositions. In such compositions, the "small. groups of atoms" (i.e., short range) of the ferroelectric seek to polarize in response to a field, but cooperative interactions (i.e., long range) are weak because of the lack of order in the amorphous material. The voltage independence may also be related to different "groups of atoms" interacting with the field at different field strengths, thereby damping out the field dependence of the response of any particular "group of atoms".

This lack of cooperative interactions also prevents the dielectric constant from becoming as high as the zero bias dielectric constant of the thin film crystalline form of the frustrated ferroelectric, e.g., of $(Ba,Sr)TiO_3$. Amorphous lead zirconium titanate (PZT) and Bi-layered perovskites will exhibit comparable behavior if deposited in their amorphous forms. Amorphous BST and other compositions that are highly ferroelectric or anti-ferroelectric in the bulk crystalline form will be useful in the same way.

Optimal compositions may be readily determined experimentally, without undue effort. The Sr deficient region of the SBT compositional spectrum yields higher dielectric constant for amorphous films as compared with SBT films of higher relative Sr content. Similar behavior is observed in BST, wherein amorphous material of the formula $(1-x) BaTiO_3-xSrTiO_3 (x=0-0.5,1.0)$ has a relative dielectric constant around 10–30 without any strong dependence on the Ba:Sr ratio. However, if the Group II (Ba+Sr) content is reduced and Ti in increased, relative dielectric constants greater than 100 can be produced in amorphous films. For perovskite ferroelectrics, highly A-site ($ABO_3$) deficient material is generally desired to achieve the highest dielectric constants for amorphous films. In addition, PbO or $Bi_2O_3$ additions to the oxides of Ti, Zr, Hf, V, Nb, Ta, Cr, Mo, W will yield high k values in corresponding amorphous films.

The features and advantages of the invention are more fully shown with reference to the following non-limiting examples.

EXAMPLE 1

Amorphous High k Low T Dielectrics—
Composition Scan

Experiment Objectives

Measurement of amorphous Sr—Bi—Ta—O capacitor film material (a precursor material for ferroelectric SBT) verified that this material could provide a low temperature route to a high k material suitable for integrated circuits.

This experiment was designed to examine the dielectric properties of SBT film materials over a region of composition space.

Sample Data

Films SBT 683–697 were grown in a 5" inverted tube reactor for a period of four consecutive days.

The substrates were nominally 100 nm Ir on 500 nm thermal $SiO_2$ on Si<100>wafers. The Ir layer was deposited in an M2I tool by sputtering at 300° C. in Ar. Films 683–697 were grown on pieces of substrates. The substrate pieces were heated in the reactor in 9 torr of flowing Ar to a surface temperature of 350° C.; the precursor began flowing to the reactor 5 seconds before the gas flow to the reactor was switched to $O_2$.

After precursor flow was stopped at the end of the run, the substrate was cooled in flowing $O_2$ (argon heatup was employed to maintain a smoother, $IrO_2$-free surface for deposition). During deposition, the chamber pressure was maintained at a pressure of 9 torr with a throttle valve. The $O_2$ flow rate was 650 sccm and He carrier gas flow rate was 200 sccm. A solution of 0.2M metalorganic in 5:4:1 octane:decane:pmdeta was delivered to the vaporizer of a liquid delivery (flash vaporization) unit at a flow rate of 0.15 ml/min.

Table I below summarizes the deposition conditions for each film, including the compositions of the metalorganic precursors and the deposition times, which were varied from run to run.

In the table, T waf=wafer temperature in degrees Centigrade; Solution Comp (atomic %)=solution composition of the respective Sr, Bi and Ta components in atomic percents, based on the total (Sr+Bi+Ta) components; deposition time= run time in minutes for deposition of the film on the wafer substrate; $P_{total}$=pressure in torr at which the film growth is carried out; He(Vap)=helium carrier gas flow rate in standard cubic centimeters per minute (sccm); and $O_2$ flow= oxygen gas flow rate into the deposition chamber, in standard cubic centimeters per minute (sccm).

TABLE I

Growth conditions for films 683–697

| Run # | T waf (° C.) | Solution Comp (atomic %) | | | Liquid flow ml/min | deposition time min. | Ptotal (torr) | He (Vap) sccm | O2 flow sccm |
| --- | --- | --- | --- | --- | --- | --- | --- | --- | --- |
| | | Sr, % | Bi, % | Ta, % | | | | | |
| 683 | 352 | 22.69 | 29.44 | 47.87 | 0.15 | 15 | 9 | 200 | 650 |
| 684 | 352 | 22.69 | 29.44 | 47.87 | 0.15 | 7 | 9 | 200 | 650 |
| 685 | 352 | 12.08 | 2.01 | 85.91 | 0.15 | 18 | 9 | 200 | 650 |
| 686 | 352 | 12.08 | 2.01 | 85.91 | 0.15 | 15 | 9 | 200 | 650 |
| 687 | 352 | 12.08 | 2.01 | 85.91 | 0.15 | 8 | 9 | 200 | 650 |
| 688 | 352 | 0.00 | 0.00 | 100.00 | 0.15 | 15 | 9 | 200 | 650 |
| 689 | 352 | 0.00 | 0.00 | 100.00 | 0.15 | 12 | 9 | 200 | 650 |

TABLE I-continued

Growth conditions for films 683–697

| Run # | T waf (° C.) | Solution Comp (atomic %) | | | Liquid flow ml/min. | deposition time min. | Ptotal (torr) | He (Vap) sccm | O2 flow sccm |
|---|---|---|---|---|---|---|---|---|---|
| | | Sr, % | Bi, % | Ta, % | | | | | |
| 690 | 352 | 0.00 | 0.00 | 100.00 | 0.15 | 6 | 9 | 200 | 650 |
| 691 | 352 | 0.00 | 15.96 | 84.04 | 0.15 | 12 | 9 | 200 | 650 |
| 692 | 352 | 0.00 | 15.96 | 84.04 | 0.15 | 13 | 9 | 200 | 650 |
| 693 | 352 | 0.00 | 15.96 | 84.04 | 0.15 | 7 | 9 | 200 | 650 |
| 694 | 352 | 0.00 | 25.00 | 75.00 | 0.15 | 13 | 9 | 200 | 650 |
| 695 | 352 | 0.00 | 25.00 | 75.00 | 0.15 | 6.5 | 9 | 200 | 650 |
| 696 | 352 | 0.00 | 46.99 | 53.01 | 0.15 | 12 | 9 | 200 | 650 |
| 697 | 352 | 0.00 | 46.99 | 53.01 | 0.15 | 6 | 9 | 200 | 650 |

Physical Measurements

Film thickness and composition results are summarized in Table II below.

The composition and thickness of all of the films were determined by XRF. Film thickness is scaled to partially fired solution deposited films, representing an upper limit of the MOCVD film thickness. The thicker films at each composition were examined by XRD and no evidence of crystallinity in the film was evident. The thicker films were also examined in grazing incidence FTIR for evidence of carbon or carbonate incorporation, with the results shown in FIGS. 5 and 6.

Figure 5:
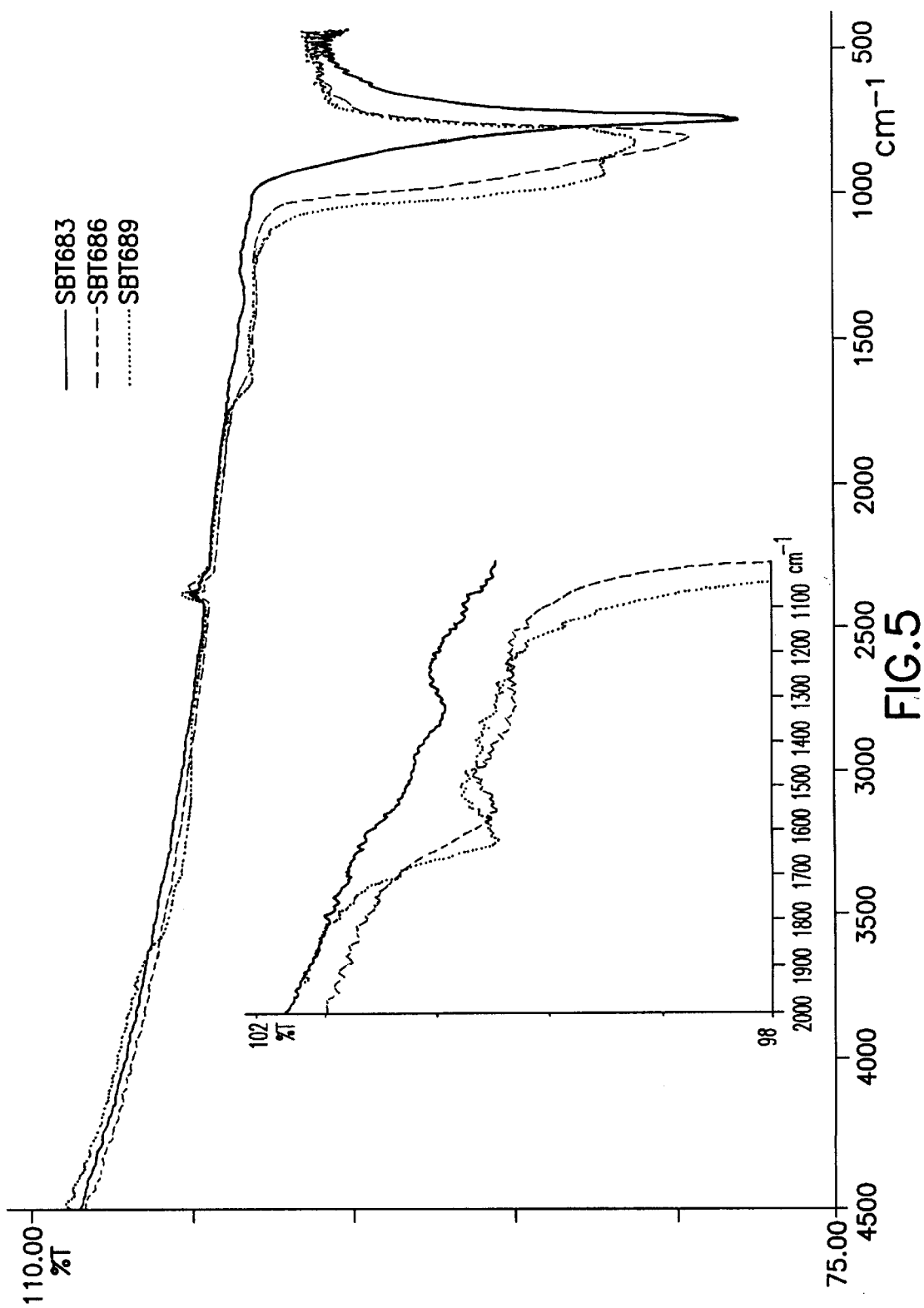
FIG. 5 is a grazing incidence FTIR plot for a ferroelectric composition film SBT 683, a Sr—Ta—O film with a small amount of Bi SBT 686, and a Ta—O film of SBT 689.

FIG. 5 is a grazing incidence FTIR of a ferroelectric composition film SBT683, a Sr—Ta—O film with a small amount of Bi SBT 686, and Ta—O film SBT 698.

Figure 6:
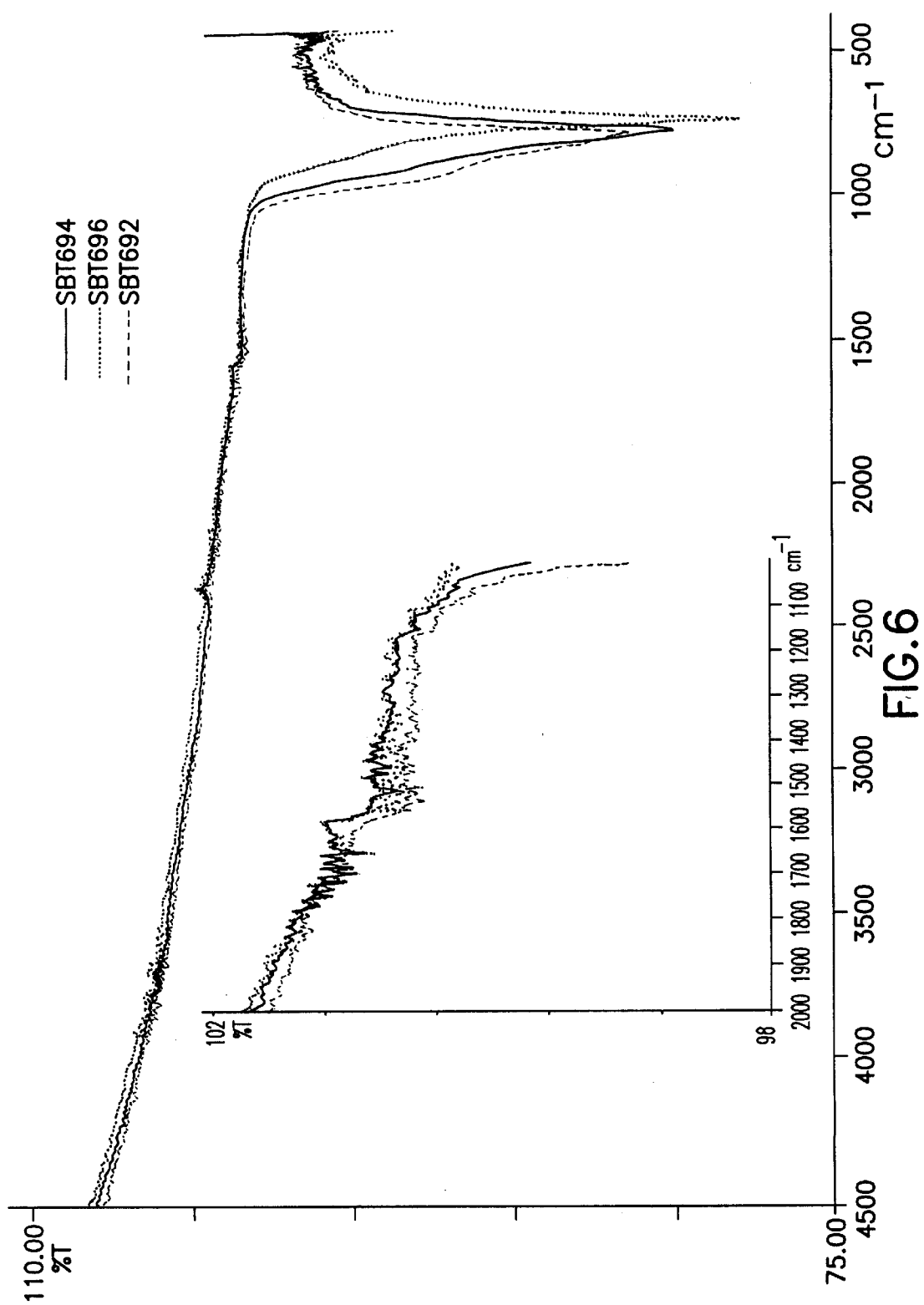
FIG. 6 is a grazing incidence FTIR plot for a Bi—Ta—O film with the ratios 27:73 in SBT 692, 37:63 in SBT 694 and 60:40 in SBT 696.

FIG. 6 is a grazing incidence FTIR of Bi—Ta—O with ratios 27:73 in SBT 692, 37:63 in SBT 694 and 60:40 in SBT 696.

In Table II, SBT thickness and Ir thickness in nanometers are set out. The atomic percent Sr, Bi and Ta components in the SBT film were determined and are tabulated.

TABLE II

Compositions and thicknesses of deposited films

| | XRF | | | | |
|---|---|---|---|---|---|
| Run # | SBT (nm) | Ir (nm) | Sr (at %) | Bi (at %) | Ta (at %) |
| 683 | 119.2964 | 104.24 | 13.997% | 43.981% | 40.114% |
| 684 | 58.25543 | 104.31 | 15.955% | 43.119% | 37.297% |
| 685 | 138.0143 | 105.01 | 15.104% | 7.324% | 75.737% |
| 686 | 111.3825 | 101.39 | 14.778% | 6.929% | 75.999% |
| 687 | 58.02369 | 98.34 | 12.598% | 7.560% | 75.704% |
| 688 | 146.2928 | 103.01 | 0.029% | 3.688% | 94.234% |
| 689 | 117.22 | 101.27 | 0.000% | 3.770% | 93.725% |
| 690 | 55.91646 | 103.09 | 0.000% | 3.648% | 91.498% |
| 691 | 105.9663 | 100.57 | 0.537% | 26.410% | 70.871% |
| 692 | 112.0435 | 103.26 | 0.582% | 27.312% | 69.814% |
| 693 | 59.84933 | 102.5 | 0.133% | 26.460% | 69.220% |
| 694 | 120.8913 | 101.72 | 0.338% | 36.261% | 61.125% |
| 695 | 59.4913 | 105.52 | 0.082% | 36.289% | 59.497% |
| 696 | 125.2946 | 104.8 | 0.454% | 56.230% | 41.210% |
| 697 | 59.90302 | 105.01 | 0.341% | 56.625% | 39.309% |

None of the films showed absorption bands around 1425 cm$^{-1}$ where carbonate would be expected. Films 686 and 689 showed some broad absorption from 1700–1550 cm$^{-1}$, which may indicate some carbon incorporation; these were the films with the lowest Bi content.

The XRF measurements were used in subsequent calculations of dielectric constant Electrical Measurements Top electrodes were formed by e-beam evaporation of Pt through a shadow mask on the amorphous material films, and electrical properties were determined for the materials.

Figure 7:
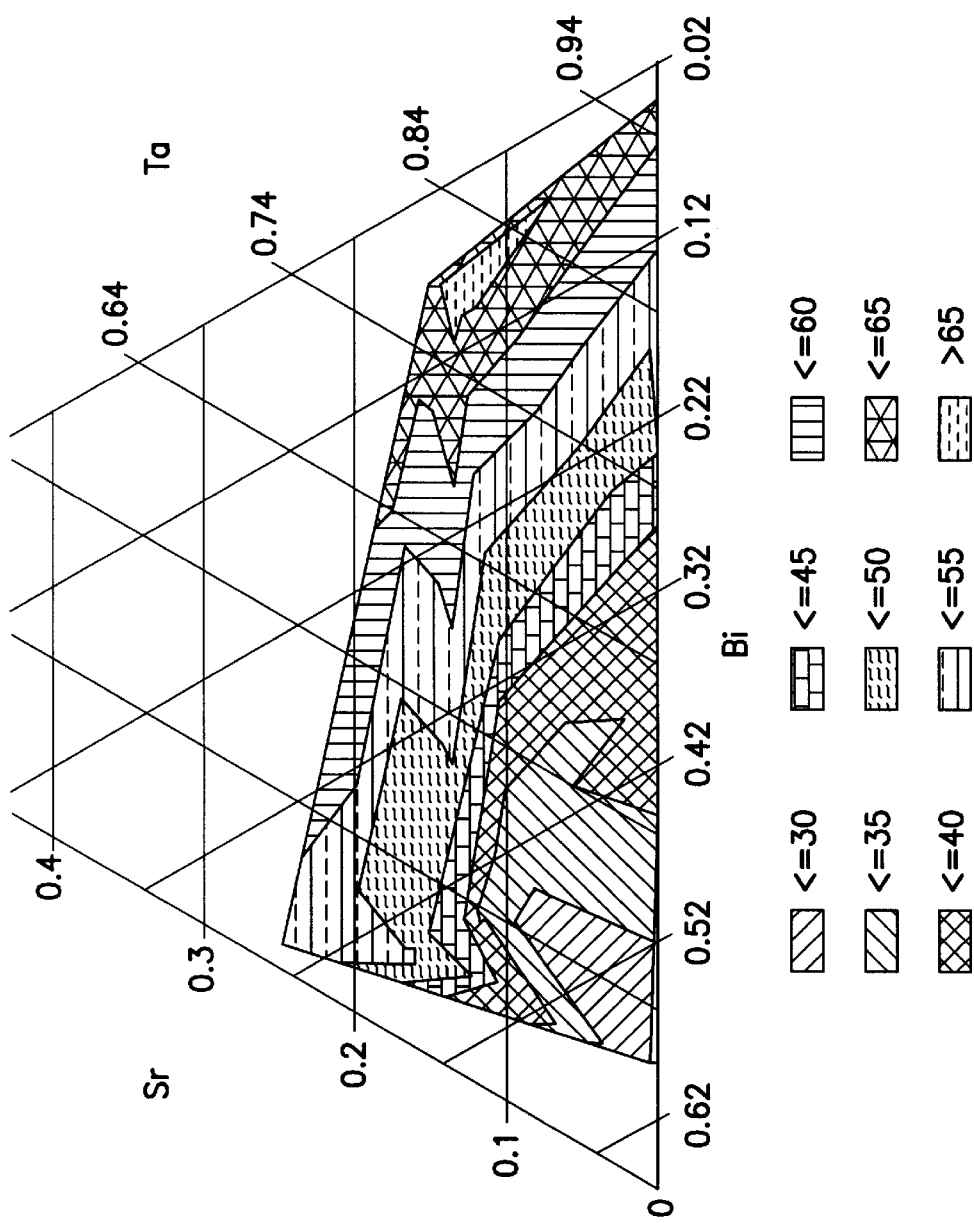
FIG. 7 is a triangular compositional plot of dielectric constant as a function of composition for as-deposited amorphous films of Sr—Bi—Ta—O.

FIG. 7 shows the dielectric constant as a function of metal content of the films from this experiment (for as-deposited amorphous films of Sr—Bi—Ta—O) together with earlier measurements on amorphous SBT.

Figure 8:
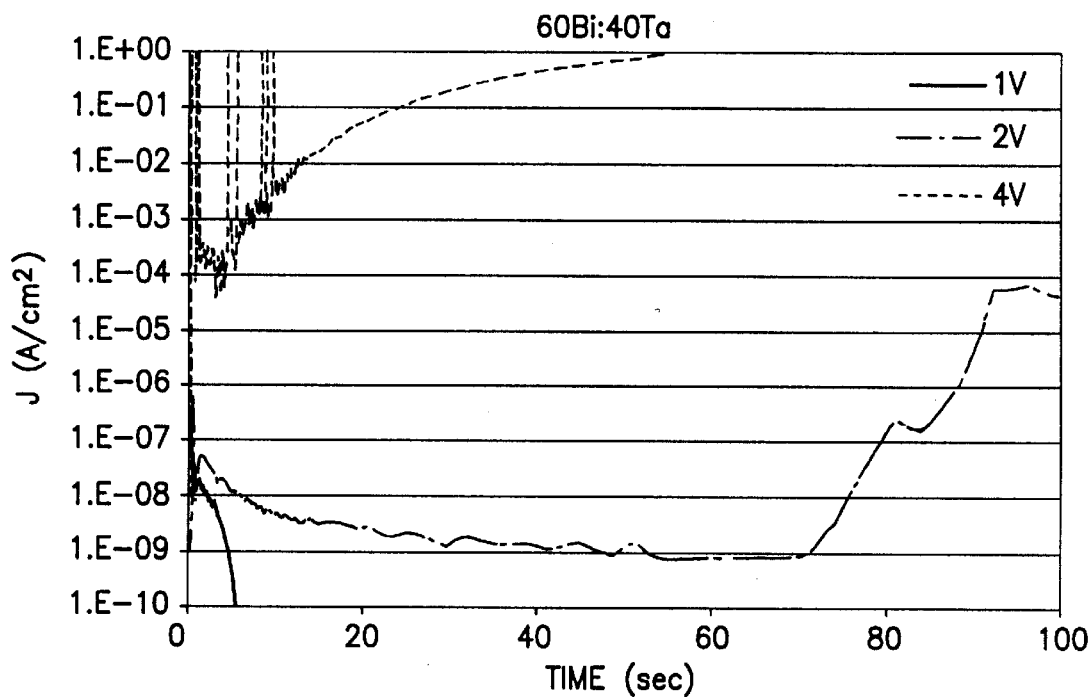
FIG. 8 is a plot of leakage as a function of time for a 60 Bi: 40 Ta film.
Figure 9:
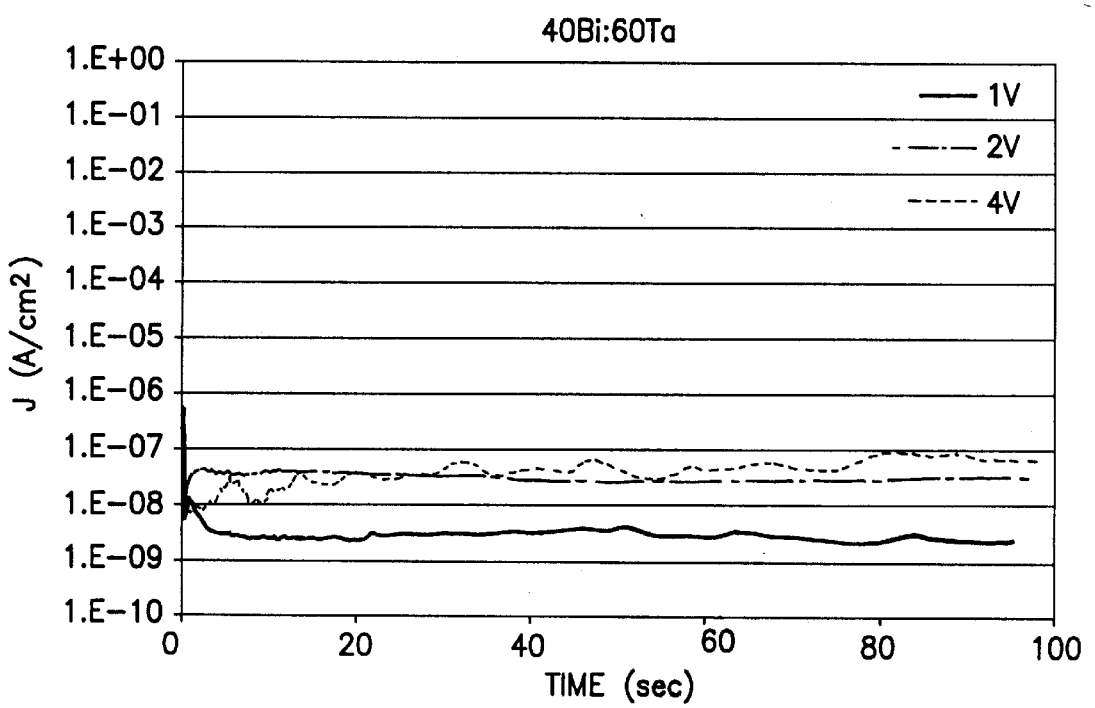
FIG. 9 is a plot of leakage as a function of time for a 40 Bi: 60 Ta film.
Figure 10:
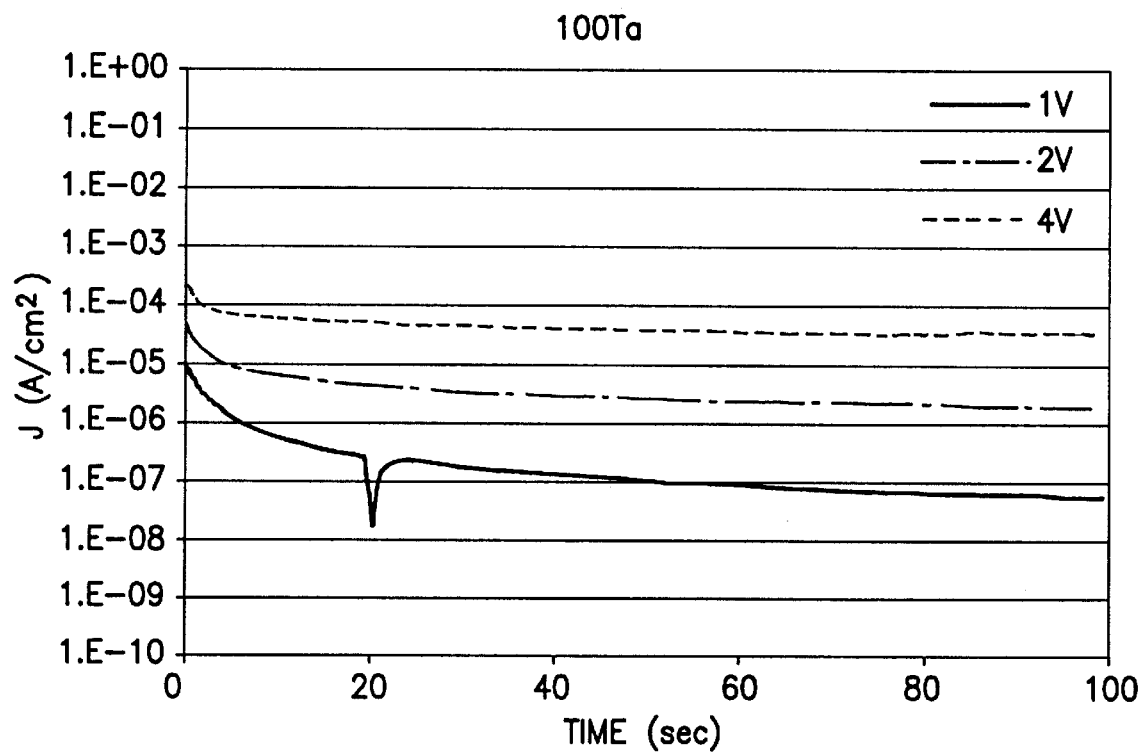
FIG. 10 is a plot of leakage as a function of time for a 100 Ta film.

FIGS. 8, 9 and 10 are graphs of leakage (A/cm$^2$) as a function of time (in seconds) for 750 Å thick films at respectively different compositions (FIG. 8=60Bi:40Ta; FIG. 9=40Bi:60Ta; and FIG. 10=100Ta). The highest Bi films had poor behavior with time. The lowest Bi films had high, voltage dependent leakage. The 40:60 Bi:Ta films had the best behavior.

A high dielectric constant was found in the 0:60:40 Sr:Bi:Ta films, but the leakage was quite high and unstable with time as shown in FIG. 8. The 0:0:100 films (FIG. 10) had relatively high, but stable, leakage (10$^{-4}$A/cm$^2$ at 4V) with clear voltage dependence. Other films had low leakage (10$^{-6}$A/cm$^2$ at 4V).

A high dielectric constant was found in films with 0:40:60 Sr:Bi:Ta composition (FIG. 9), and this gave a capacitance density of 8.4 fF/$\mu$m$^2$ for a film thickness of 595 Å.

When the same sample of material used to generate the data of FIG. 9 was subsequently independently measured with other analysis equipment, it was determined to have a capacitance density of 9.5 fF/$\mu$m$^2$ at 77° K. and 10.0 fF/$\mu$m$^2$ at 296° K. The variation in top electrode areas from capacitor to capacitor could account for these differences; a nominal value was used for all samples in the aforementioned subsequent measurement.

Figure 11:
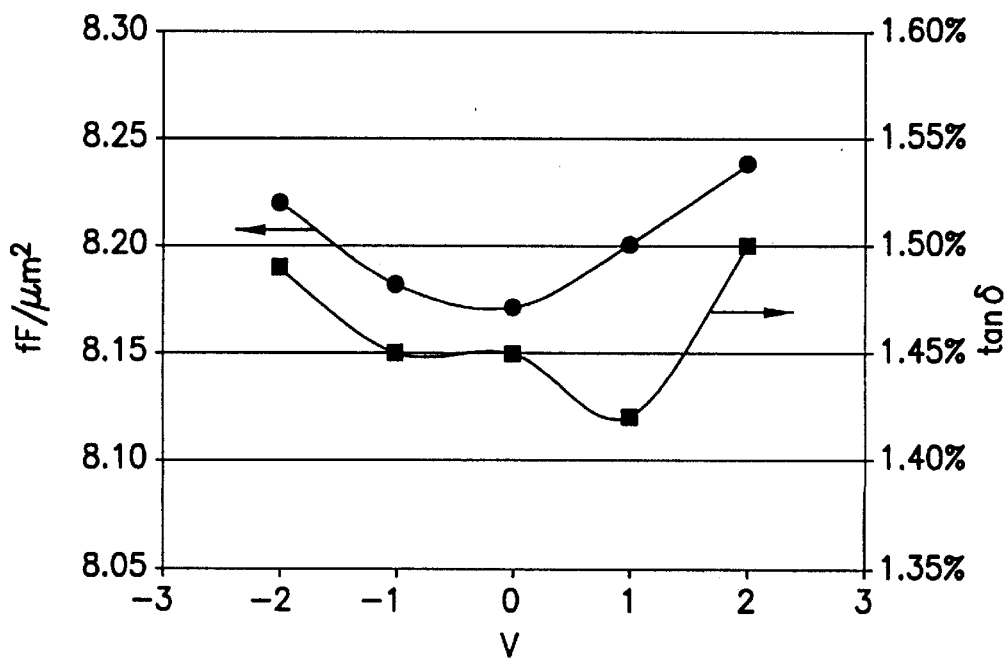
FIG. 11 is a graph of capacitance density and loss as a function of bias voltage (room temperature measurement with 0.1 V oscillation) for film 695.

The capacitance (and loss) of the amorphous film increased slightly as the bias voltage was increased, as shown in FIG. 11, which is a graph of capacitance density in fF/$\mu$m$^2$ and loss (tan δ) as a function of bias voltage (room temperature measurement with 0.1 V oscillation), for film 695. The change was less than 0.5% capacitance/V.

Conclusions

There was a significant range of compositions where amorphous Bi—Ta—O and Sr—Bi—Ta—O materials had properties better than amorphous Ta$_2$O$_5$. There was no evidence that Sr substantially enhanced the dielectric properties.

As demonstrated by this example, the optimum composition for the amorphous dielectric film contains the elements of the bulk ferroelectric with a stoichiometry that is significantly away from the optimum ferroelectric stoichiometry. This same behavior has been observed in the case of Ba—Sr—Ti—O as described in U.S. Pat. No. 5,932,905, wherein compositions from 65–90% Ti on the metal site produced the best combination of capacitance, leakage, and linearity. Such phenomena is general and for each ferroelectric composition herein aforementioned, a highly favorable amorphous dielectric composition is located nearby.

EXAMPLE 2

Amorphous High k Low T Dielectrics—Thickness Scan

Experiment Objectives

Measurement of amorphous Sr—Bi—Ta—O capacitor film material (a precursor material for ferroelectric SBT) verified that this material could provide a low temperature route to a high k material suitable for integrated circuits.

This experiment was designed to examine the dielectric properties as a function of film thickness and deposition temperature at a composition of approximately 40:60 Bi:Ta, which was identified as a preferred material in the broad composition scan of Example 1.

Film Growth Details

Films S44–57 were grown in a "SorBeT" modified Watkins-Johnson reactor. The substrates employed were 150 mm substrates that had nominally 100 nm Ir contacts on 500 nm thermal $SiO_2$ on Si<100>. The Ir layer was deposited by Ir sputtering at 300° C. in Ar. The substrates were heated in the reactor in 9 torr of flowing He to the growth temperature; the precursor gas began flowing to the reactor 5 seconds before the gas flow to the reactor was switched from He to $O_2$. After the precursor flow was stopped at the end of the run, the films were cooled in flowing $O_2$. The inert heatup was employed to maintain a smoother, $IrO_2$-free surface for deposition. During deposition, the chamber pressure was maintained at 9 torr with a throttle valve. The $O_2$ flow rate was 1000 sccm and the He carrier gas flow rate was 200 sccm. A solution of 0.2M metalorganic in 5:4:1 octane:decane:pmdeta was delivered to the vaporizer at 0.3 ml/min.

Table III below summarizes the deposition conditions for each film, including the compositions of the metalorganic precursors and the deposition times that were varied from run to run. Runs S56–57 were performed with test dies containing working transistors glued to the top of the substrate with silver paste. In Run S56 the film material was deposited at nominally 388° C. and in run S57 the film material was deposited at nominally 353° C., each with a 15 minute deposition time and a solution composition appropriate for the temperature. In the table, the variables were the same as in Example 1 for Table I, except that Solution Composition (atomic %)=solution composition of the respective Bi and Ta components in atomic percents, based on the total (Bi+Ta) components.

Growth conditions for films 44–55

TABLE III

Growth conditions for films 44–55

| Run # | T wafer (° C.) | Solution Composition (atomic %) Bi | Solution Composition (atomic %) Ta | Liquid flow ml/min | deposition time min. | Ptotal (torr) | He (Vap) sccm | O2 flow sccm |
|---|---|---|---|---|---|---|---|---|
| 44 | 353 | 44.00% | 56.00% | 0.30 | 28 | 9 | 200 | 1000 |
| 45 | 353 | 44.00% | 56.00% | 0.30 | 3 | 9 | 200 | 1000 |
| 46 | 353 | 44.00% | 56.00% | 0.30 | 4.5 | 9 | 200 | 1000 |
| 47 | 353 | 44.00% | 56.00% | 0.30 | 6 | 9 | 200 | 1000 |
| 48 | 353 | 44.00% | 56.00% | 0.30 | 9 | 9 | 200 | 1000 |
| 49 | 353 | 44.00% | 56.00% | 0.30 | 12 | 9 | 200 | 1000 |
| 50 | 353 | 44.00% | 56.00% | 0.30 | 15 | 9 | 200 | 1000 |
| 51 | 353 | 44.00% | 56.00% | 0.30 | 18 | 9 | 200 | 1000 |
| 52 | 388 | 44.00% | 56.00% | 0.30 | 18 | 9 | 200 | 1000 |
| 53 | 388 | 55.00% | 45.00% | 0.30 | 18 | 9 | 200 | 1000 |
| 54 | 388 | 55.00% | 45.00% | 0.30 | 12 | 9 | 200 | 1000 |
| 55 | 388 | 55.00% | 45.00% | 0.30 | 6 | 9 | 200 | 1000 |

Physical Measurements

Figure 12:
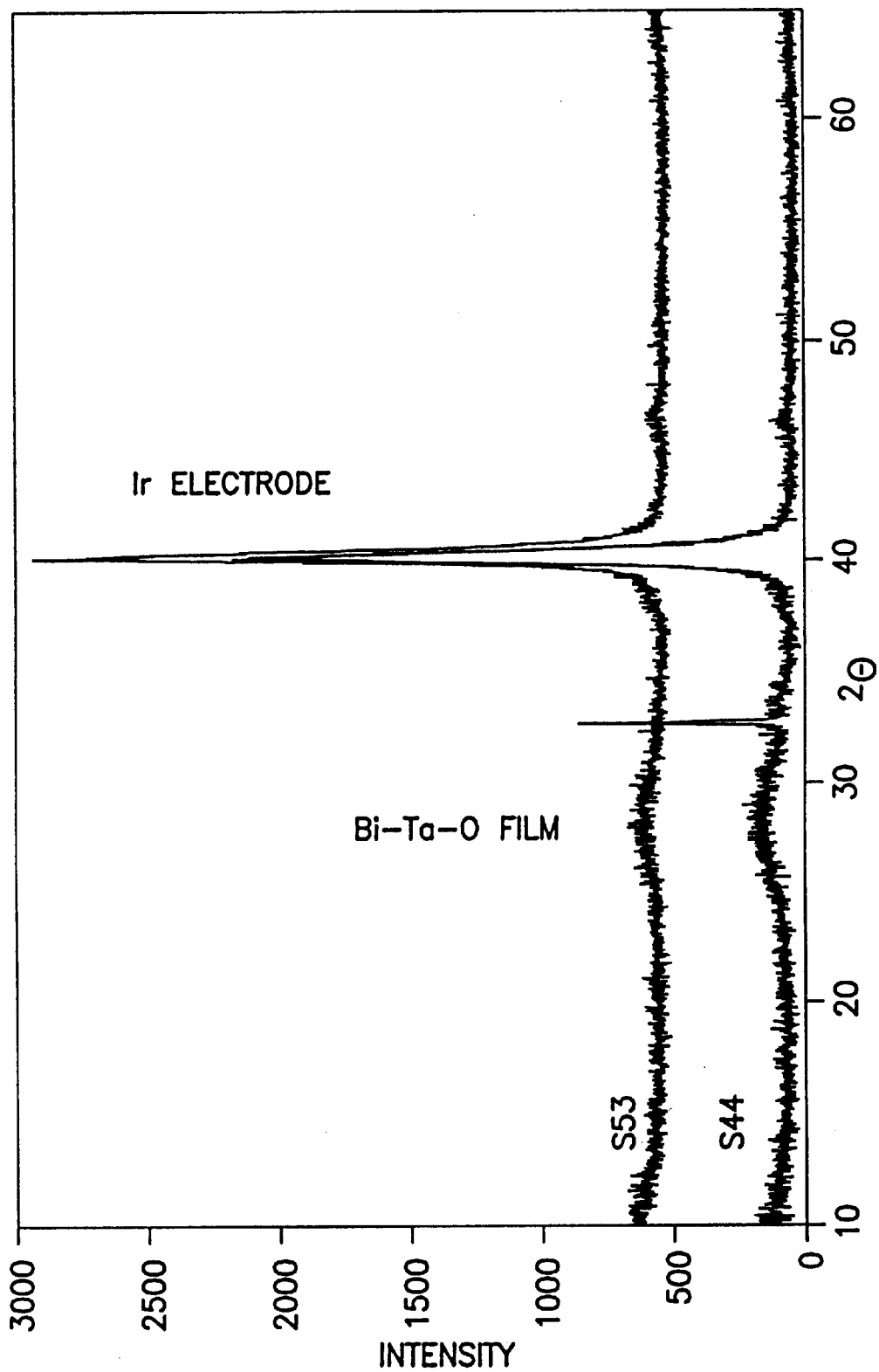
FIG. 12 shows x-ray diffraction spectra of Bi—Ta—O films grown at 353° C. (S44) and at 388° C. (S53) showing only a hump from the film.

Film thickness and composition results are summarized in Table IV. The composition and thickness of all of the films were determined by XRF. The thickness values from SBT5 were normalized to RBS results with theoretical density, so they represented a lower limit to the physical thickness. The thickest films for each temperature, S44 and S53, were examined by XRD. No evidence of crystallinity in the film was evident as shown by the XRD spectra in FIG. 12 for films grown at 353° C. (S44) and 388° C. (S53).

FIGS. 13 and 14 show AFM scans over 1×1 μm areas for films grown at 353° C. There may be a small increase in film roughness with increasing thickness, but the roughness is similar to that of the bottom electrode. FIG. 15 shows AFM scans over a 1×1 μm area for a film grown at 388° C. There is a factor of 10 increase in the film roughness compared to films grown at 353° C.

TABLE IV

Compositions and thicknesses of deposited films

| Run # | SBT (nm) | Ir (mn) | Bi (at %) | Ta (at %) |
|---|---|---|---|---|
| 44 | 122.9 | 103 | 43.638 | 55.971 |
| 45 | 12.39 | 103 | 42.284 | 57.419 |
| 46 | 19.51 | 103 | 42.699 | 57.034 |
| 47 | 25.79 | 103 | 42.708 | 57.292 |
| 48 | 38.93 | 105 | 44.014 | 55.958 |
| 49 | 51.64 | 103 | 42.793 | 57.007 |
| 50 | 65.47 | 103 | 43.824 | 55.828 |
| 51 | 78.18 | 104 | 43.788 | 55.975 |
| 52 | 77.04 | 103 | 33.029 | 66.591 |
| 53 | 65.54 | 102 | 44.732 | 55.268 |
| 54 | 46.05 | 103 | 46.819 | 52.929 |
| 55 | 22.34 | 104 | 47.039 | 52.935 |

Electrical Measurements

Figure 16:
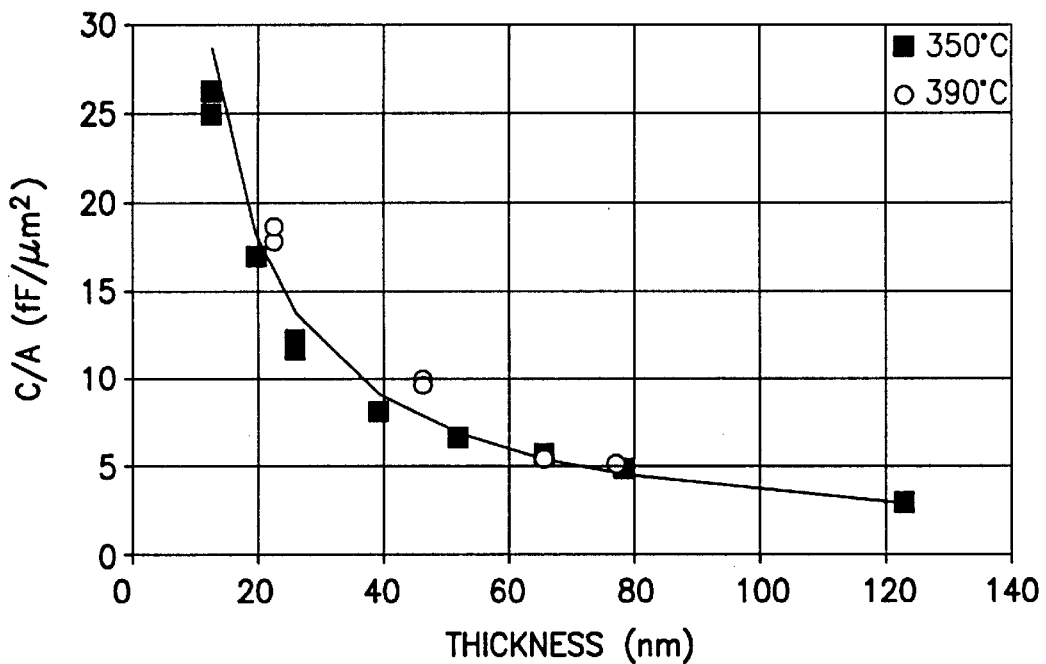
FIG. 16 is a graph of capacitance as a function of film thickness for films grown at 353° C. and 388° C.

Top electrodes were formed by e-beam evaporation of Pt through a shadow mask. The capacitance was plotted as a function of film thickness as shown in FIG. 16, for films grown at 350° C. and 390° C. The capacitance of the thinner films may be slightly higher for the films grown at 390° C. The capacitance values measured for these unoptimized films, of 10–25 fF/$\mu$m$^2$, are significantly greater than the values of 2–4 fF/$\mu$m$^2$ characteristic of the best backend processes in current production in the art, and compositional optimization, with the addition of elements from the lanthanide series, Y, Ti, Zr, Hf, V, Nb, Cr, Mo, W, Ba, etc., may be employed to further improve the behavior of the product films.

Figure 17:
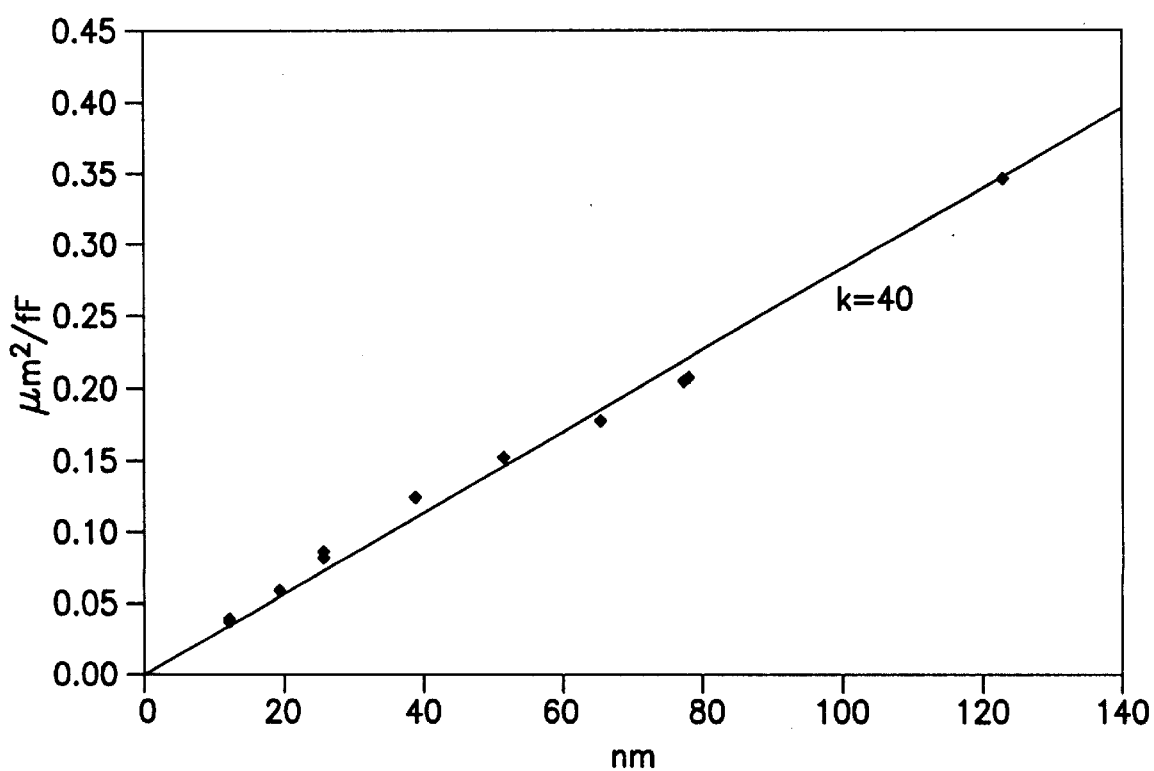
FIG. 17 is a graph of inverse capacitance as a function of thickness.

The inverse capacitance (in $\mu$m$^2$/fF) as a function of thickness (in nanometers) is plotted in FIG. 17 for the amorphous material; the intercept is near zero, indicating a uniform dielectric constant, i.e., no "interfacial" capacitance as is often found with crystalline high k materials.

Figure 18:
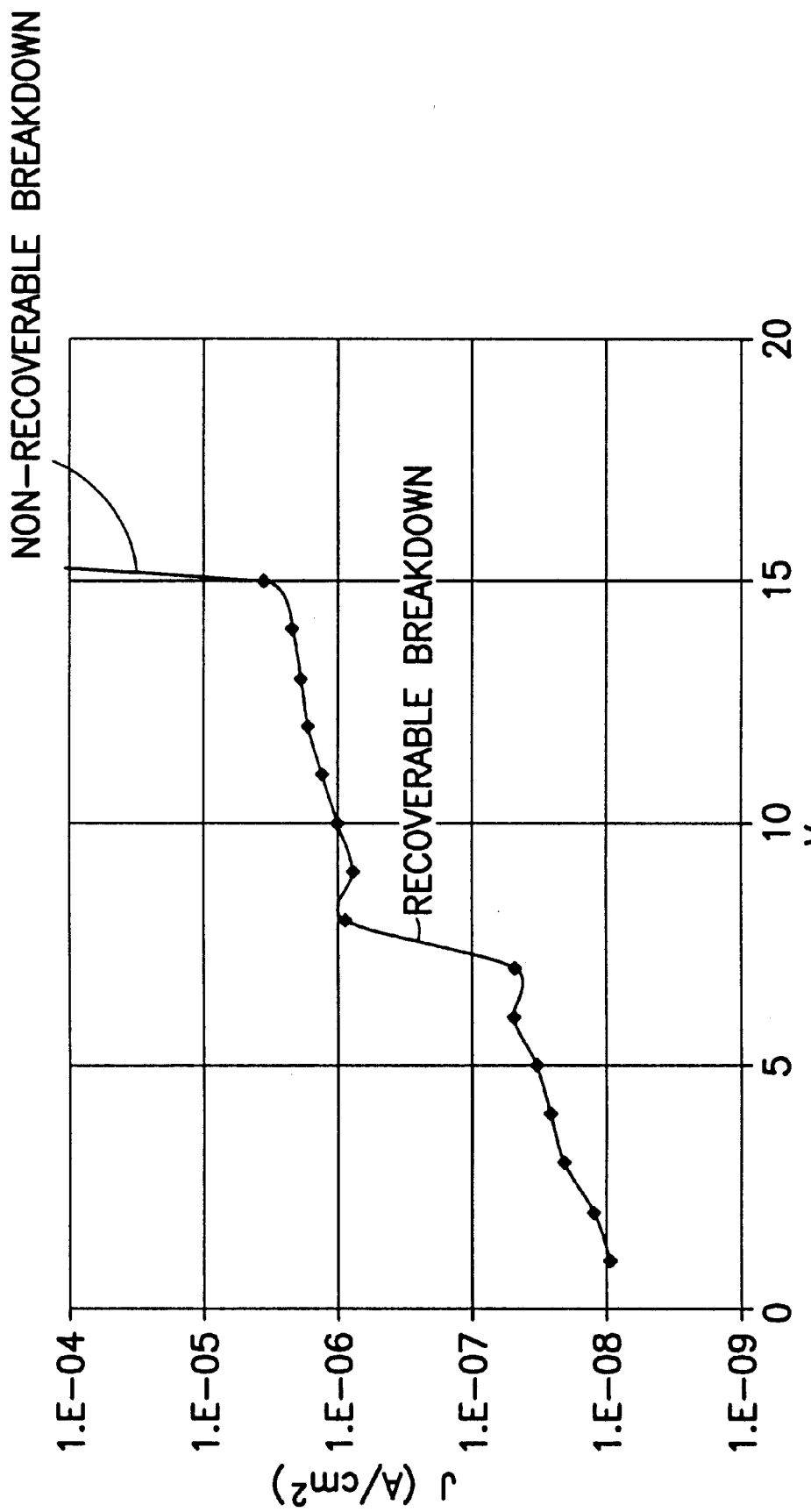
FIG. 18 is a graph of leakage current as a function of voltage for sample S49 (520 Angstroms thickness) showing two regimes of leakage separated by a "recoverable breakdown" and a "non-recoverable breakdown" at higher voltages.

The leakage behavior of the amorphous films is typified by two regimes, separated by a "recoverable breakdown," as evidenced in FIG. 18, showing leakage current as a function of voltage for sample S49 (520 Å thickness). A leakage measurement system was employed having a 20 V power supply. The leakage in both regimes followed a generally log-linear behavior.

Figure 19:
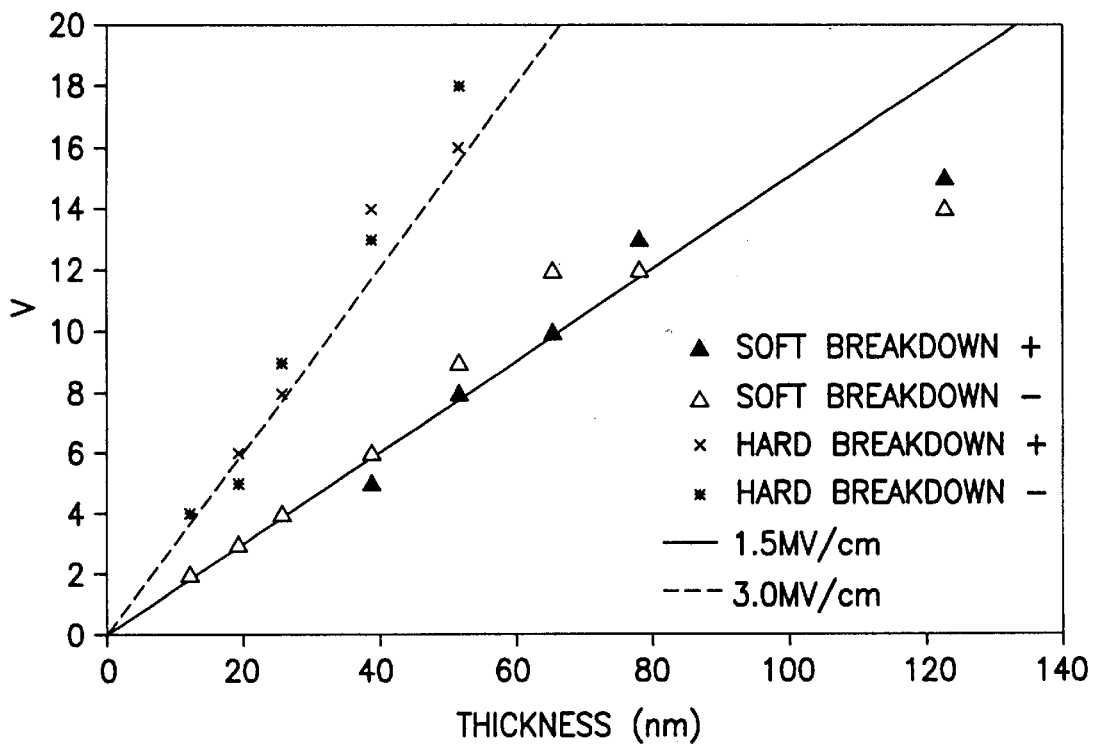
FIG. 19 is a graph of breakdown voltages as a function of film thickness for films grown at 353° C.

Both the recoverable and non-recoverable breakdown voltages scaled linearly with film thickness for the films grown at 353° C., as shown in FIG. 19. The recoverable breakdown occurred at a field of approximately 1.5 MV/cm; the non-recoverable breakdown occurred at a field of approximately 3.0 MV/cm.

The breakdown behavior of the films grown at 388° C. was much less well-defined with recoverable breakdown occurring at 0.4–0.9 MV/cm for a positive bias and at 1.7–2.2 MV/cm for a negative bias. Non-recoverable breakdown occurred at 1.0–1.3 MV/cm for a positive bias and 2.0–2.7 MV/cm for a negative bias. The variation from cap to cap and the lower field breakdown for a positive bias supported the conclusion that the roughness of the bottom electrode was controlling the breakdown. This conclusion was also consistent with the higher roughness seen in the AFM scans for the higher growth temperature films.

Figure 20:
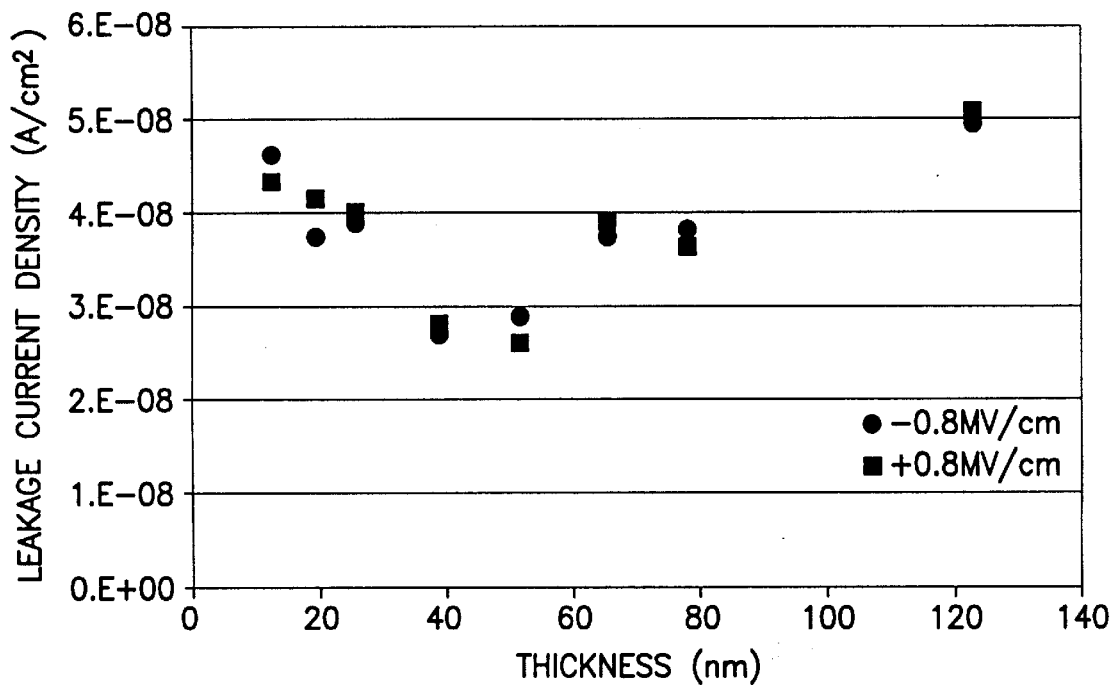
FIG. 20 is a graph of leakage as a function of film thickness for a constant field of 0.8 MV/cm.

The leakage current as a function of film thickness is shown in FIG. 20 at a constant field of 0.8 MV/cm, about half the recoverable breakdown field. The leakage changes by less than a factor of 2, reflecting the character of this amorphous film material as nearly largely "bulk" (rather than interface) controlled.

Transistor Results

The test dies that went through the amorphous film deposition at both temperatures survived with little to no change in device performance.

Conclusions

These films showed higher specific capacitance with low leakage than other films grown at the same temperatures. The capacitance scaled well with film thickness indicating uniform field and dielectric constant through the thickness of the films. The breakdown behavior also scaled well with thickness, confirming the uniform field through the dielectric.

EXAMPLE 3

On a conventional Si wafer (4 or 6 inch diameter) was deposited a SiO$_2$ barnier layer (100–400 nm thick) by conventional wet oxidation over the whole wafer surface. Onto the SiO$_2$ barrier layer was deposited a Pt layer (exemplarily 100 nm thick) by conventional sputtering. The Pt layer also extended over the whole wafer surface and served as the bottom electrode. Onto the Pt layer was deposited a thin film (typically 40 nm) of the titanate according to the invention by MOCVD, as described above. The titanate film also extended over the whole wafer surface. Top electrodes were formed on the titanate layer by e-beam evaporation of about 100 nm Pt through a shadow mask at about 200° C.

EXAMPLE 4

Figure 21:
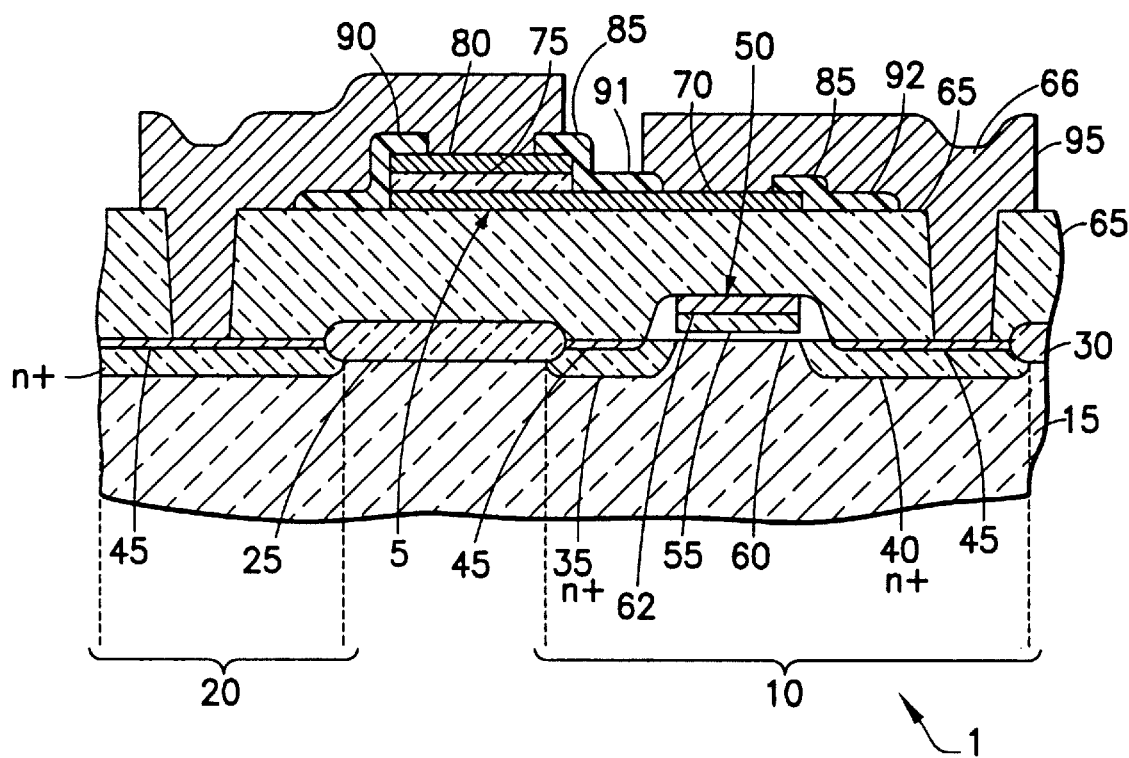
FIG. 21 schematically depicts a portion of an IC with an integrated capacitor according to one embodiment of the invention.

An exemplary IC with an integral capacitor in accordance with the invention is shown in FIG. 21. The illustrated portion of integrated circuit 1 includes a first active device 10, such as a conventional metal-oxide-semiconductor field effect transistor (MOSFET), and a capacitor 5 employing a dielectric film layer of Ba—Sr—Ti-oxide formed on a substrate 15, such as a silicon substrate. A drain region of a second transistor 20 is also shown. The particular types of active devices employed, e.g., NMOS, PMOS or CMOS, are based on the desired operation of the integrated circuit and are not critical for practicing the present invention. Other suitable active devices include, for example, bipolar junction transistors and GaAs MESFETs. The transistors 10 and 20 can be fabricated, for example, by conventional processing methods. In FIG. 21, the transistors 10 and 20 include field oxide regions 25 and 30 that are formed, for example, by SiO$_2$ and operate as insulators between the transistor 10 and adjacent devices, such as the transistor 20. Source and drain regions 35 and 40 of the transistor 10 are formed by doping with n-type impurities, such as arsenic or phosphorous for NMOS. An optional layer of silicide 45 is deposited over the source and drain regions 35 and 40 to reduce the source and drain resistance, which enables greater current delivery by the transistor 10.

A gate 50 of the transistor includes, for example, polysilicon 55 doped with an n-type impurity, such as by an implant or vapor doping. An optional layer of silicide 62 is also deposited over the gate polysilicon 55 to reduce the electrical resistance of the gate 50. An insulating layer 65 of, for example, P-glass which is an oxide doped with phosphorous is then deposited on the transistors 10 and 20 to provide protection to the transistors 10 and 20 and to facilitate electrical connection. Contact windows 66 are then etched in the insulating layer 65 to expose the device gate 50 and source and drain regions, such as the regions 35 and 40. Although only the drain regions of the transistors 10 and 20 are exposed in the cross-section of the integrated circuit illustrated in FIG. 21, it should be readily understood that the gate and source are exposed at other areas of the integrated circuit 1 that are outside the illustrated cross-section.

At least one capacitor, such as the capacitor 5, is formed on the integrated circuit, such as on the insulating layer surface.

The capacitor 5 includes a first electrode 70 formed on the insulating layer surface, a dielectric thin film region 75 on the first electrode 70, and a second electrode 80 formed on the dielectric film region 75 opposite the first electrode 70. The dielectric thin film region 75 comprises an amorphously frustrated ferroelectric material fabricated at temperature below 500° C. in accordance with the present invention.

It is possible for the first electrode 70 to have a two layer structure. Such a structure is, for example, a layer of platinum formed over a layer of Ti-nitride. Platinum is a suitable electrode material, however, it adversely chemically reacts with silicon. As a consequence, a diffusion barrier is employed as the second electrode layer which is in contact with the insulating layer surface to substantially prevent a chemical reaction between the platinum and the silicon of the substrate 15.

Suitable thicknesses for each layer of the two-layer structure are in the range of 0.01 to 0.5 $\mu$m. Thicknesses less than 0.1 $\mu$m are undesirable because of its high electrical resistance while thicknesses greater than 0.5 $\mu$m are generally disadvantageous because of high fabrication cost and poor adherence. The first electrode 70 is larger than the second electrode 80 to provide electrical connection to the first electrode 70.

After formation of the capacitor 5, an insulating material 85, such as, for example, $SiO_2$ is deposited on edge regions 90, 91 and 92 of the capacitor 5 to prevent short circuits between the first and second capacitor electrodes 70 and 80 when the interconnection layer is formed. An interconnection layer 95 then is formed on the insulation layer and corresponding etched contact windows to electrically connect the devices 10 and 20 and the capacitor 5 in a desired manner. Suitable materials for the interconnection layer 95 include aluminum and copper. In the integrated circuit 1, the drain 40 of the transistor 10 is electrically connected to the first electrode 70 of the capacitor 80 and the capacitor's second electrode 80 is electrically connected to the source of the transistor 20.

While the invention has been illustratively described herein with reference to various embodiments and disclosed features, it will be appreciated that the invention is not thus limited, but rather extends to and encompasses numerous variations, modifications and other embodiments. Accordingly, the invention is intended to be broadly construed and interpreted as including all such variations, modifications and other embodiments within the spirit and scope thereof, as hereinafter claimed.

What is claimed is:

1. A paraelectric amorphous metal oxide dielectric material, said material:
   (a) when formed as a thin film by CVD, having properties comprising:
      (i) a voltage independent capacitance;
      (ii) a capacitance density of from about 1000 to about 10,000 nF/cm$^2$; and
      (iii) a current leakage of <10$^{-7}$ A/cm$^2$; and
   (b) being annealable to produce a fefroelectric crystalline material in thin film and bulk forms.

2. The material of claim 1, having a capacitance that is substantially independent of bias voltage.

3. The material of claim 1, having a capacitance characterized by <0.5% change over a range of bias voltage from 0 to 250 kV/cm.

4. The material of claim 1, having a capacitance that is substantially independent of temperature.

5. The material of claim 1, having a capacitance characterized by <10% change over a range of temperature from 298° K. to 77° K.

6. The material of claim 1, wherein the metal of said metal oxide comprises bismuth.

7. The material of claim 6, wherein the metal of said metal oxide further comprises tantalum.

8. The material of claim 7, wherein the metal of said metal oxide further comprises strontium.

9. The material of claim 1, wherein the metal of said metal oxide comprises titanium.

10. The material of claim 9, wherein the metal of said metal oxide further comprises barium.

11. The material of claim 10, wherein the metal of said metal oxide further comprises strontium.

12. The material of claim 1, as a component of a capacitor in a microelectronic device structure.

13. The material of claim 1, selected from the group consisting of barium titanate, strontium titanate, barium strontium titanate, strontium bismuth tantalate, bismuth titanate, and lead zirconium titanate.

14. The material of claim 1, comprising an A-site (ABO$_3$) deficient material.

15. The material of claim 1, comprising PbO or Bi$_2$O$_3$ additions to an oxide of one or more metals selected from the group consisting of titanium, zirconium, hafnium, vanadium, niobium, tantalum, chromium, molybdenum, and tungsten.

16. The material of claim 1, comprising an alloying component selected from the group consisting of La, Nb, Zr, Hf, W, and Ba.

17. The material of claim 1, comprising SrBi$_2$Ta$_2$O$_9$.

18. The material of claim 1, comprising Bi$_4$Ti$_3$O$_{12}$.

19. The material of claim 1, comprising (Ba,Sr)TiO$_3$.

20. The material of claim 1, comprising a Ba—Sr—Ti-oxide.

21. The material of claim 1, comprising a Sr—Bi—Ta-oxide.

22. An amorphous, metal oxide, dielectric, paraelectric material, said material:
   (a) when formed as a paraelectric thin film by CVD, having properties comprising:
      (i) a voltage independent capacitance;
      (ii) a capacitance density of from about 1000 to about 10,000 nF/cm$^2$;
      (iii) a current leakage of <10$^{-7}$ A/cm$^2$; and
      (iv) a ratio of metal in the dielectric paraelectric thin film selected from the group consisting of:
         (I) 0 to 20% strontium, 5 to 70% bismuth and 10 to 95% tantalum;
         (II) 0 to 10% strontium, 5 to 55% bismuth and 35 to 95% tantalum; and
         (III) 0 to 5% strontium, 15 to 50% bismuth and 45 to 85% tantalum; and
   (b) a stoichiometric composition that is different from the stoichiometric composition of a bulk crystalline material of the same elements that is annealable to yield a bulk ferroelectric material.

23. A thin film capacitor microelectronic device structure, comprising:
   a first electrode;
   a thin film of an amorphous paraelectric metal oxide material, said material:
      (a) when formed as a thin film by CVD, having properties comprising:
         (i) a voltage independent capacitance;
         (ii) a capacitance density of from about 1000 to about 10,000 nF/cm$^2$; and
         (iii) a current leakage of <10$^{-7}$ A/cm$^2$; and
      (b) being annealable to produce a ferroelectric crystalline material in thin film and bulk forms; and
   a second electrode.

24. The structure of claim 23, wherein the amorphous paraelectric metal oxide thin film material has a root mean square roughness <1 nanometer, independent of film thickness.

25. The structure of claim 23, wherein the amorphous paraelectric metal oxide thin film material has an inverse capacitance that scales as a ratio of film thickness.

26. The structure of claim 23, wherein the amorphous paraelectric metal oxide thin film has substantially uniform dielectric constant throughout the film.

27. The structure of claim 23, wherein the amorphous paraelectric metal oxide thin film material has a capacitance that is substantially independent of bias voltage.

28. The structure of claim 23, wherein the amorphous paraelectric metal oxide thin film material has a capacitance characterized by <0.5% change over a range of from 0 to 250 kV/cm.

29. The structure of claim 23, wherein the amorphous paraelectric metal oxide thin film material has a capacitance that is substantially independent of temperature.

30. The structure of claim 23, wherein the amorphous paraelectric metal oxide thin film material has a capacitance characterized by <10% change over a range 1 from 298° K. to 77° K.

31. The structure of claim 23, wherein the metal of said metal oxide comprises bismuth.

32. The structure of claim 31, wherein the metal of said metal oxide further comprises tantalum.

33. The structure of claim 31, wherein the metal of said metal oxide further comprises strontium.

34. The structure of claim 23, wherein the metal of said metal oxide comprises titanium.

35. The structure of claim 34, wherein the metal of said metal oxide further comprises barium.

36. The structure of claim 35, wherein the metal of said metal oxide further comprises strontium.

37. The structure of claim 23, wherein the amorphous paraelectric metal oxide thin film material comprises a material selected from the group consisting of barium titanate, strontium titanate, barium strontium titanate, strontium bismuth tantalate, bismuth titanate and lead zirconium titanate.

38. The structure of claim 23, wherein the amorphous paraelectric metal oxide thin film material comprises an A-site ($ABO_3$) deficient material.

39. The structure of claim 23, wherein the amorphous paraelectric metal oxide thin film material comprises PbO or $Bi_2O_3$ additions to an oxide of one or more metals selected from the group consisting of titanium, zirconium, hafnium, vanadium, niobium, tantalum, chromium, molybdenum and tungsten.

40. The structure of claim 23, wherein the amorphous paraelectric metal oxide thin film material comprises an alloying component selected from the group consisting of La, Nb, Zr, Hf, W and Ba.

41. The structure of claim 23, wherein the amorphous paraelectric metal oxide thin film material comprises $SrBi_2Ta_2O_9$.

42. The structure of claim 23, wherein the amorphous paraelectric metal oxide thin film material comprises $Bi_4Ti_3O_{12}$.

43. The structure of claim 23, wherein the amorphous metal oxide thin film material comprises (Ba,Sr)$TiO_3$.

44. The structure of claim 23, wherein the amorphous metal oxide thin film material comprises a Ba—Sr—Ti-oxide.

45. The structure of claim 23, wherein the amorphous metal oxide thin film material comprises a Sr—Bi—Ta-oxide.

46. The structure of claim 23, comprising an integrated circuit chip.

47. A thin film capacitor microelectronic device structure, comprising:
a first electrode;
an amorphous paraelectric, metal oxide, dielectric thin film material, said material:
(a) when formed as a paraelectric thin film by CVD, having properties comprising:
(i) a voltage independent capacitance;
(ii) a capacitance density of from about 1000 to about 10,000 nF/cm$^2$;
(iii) a current leakage of <$10^{-7}$ A/cm$^2$; and
(iv) a ratio of metal in the dielectric paraelectric thin film selected from the group consisting of:
(I) 0 to 20% strontium, 5 to 70% bismuth and 10 to 95% tantalum;
(II) 0 to 10% strontium, 5 to 55% bismuth and 35 to 95% tantalum; and
(III) 0 to 5% strontium, 15 to 50% bismuth and 45 to 85% tantalum; and
(b) a stoichiometric composition that is different from the stoichiometric composition of a bulk crystalline material of the same elements that is annealable to yield a bulk ferroelectric material; and
a second electrode.

48. A method of forming a thin film capacitor structure on a substrate, comprising:
forming a first electrode on the substrate;
depositing on the first electrode a layer of amorphous paraelectric metal oxide thin film material, said material:
(a) when formed as a thin film by CVD, having properties comprising:
(i) a voltage independent capacitance;
(ii) a capacitance density of from about 1000 to about 10,000 nF/cm$^2$; and
(iii) a current leakage of <$10^{-7}$ A/cm$^2$; and
(b) being annealable to produce a ferroelectric crystalline material in thin film and bulk forms; and
forming a second electrode on the layer of amorphous paraelectric metal oxide thin film material.

49. The method of claim 48, wherein the amorphous paraelectric metal oxide thin film material has a root mean square roughness <1 nanometer, independent of film thickness.

50. The method of claim 48, wherein the amorphous paraelectric metal oxide thin film material has an inverse capacitance that scales as a ratio of film thickness.

51. The method of claim 48, wherein the amorphous paraelectric metal oxide thin film material has substantially uniform dielectric constant throughout the film.

52. The method of claim 48, wherein the amorphous paraelectric metal oxide thin film material has a capacitance that is substantially independent of bias voltage.

53. The method of claim 48, wherein the amorphous paraelectric metal oxide thin film material has a capacitance characterized by <0.5% change over a range of bias voltage from 0 to 250 kV/cm.

54. The method of claim 48, wherein the amorphous paraelectric metal oxide thin film material has a capacitance that is substantially independent of temperature.

55. The method of claim 48, wherein the amorphous paraelectric metal oxide thin film material has a capacitance characterized by <10% change over a range of temperature from 298° K. to 77° K.

56. The method of claim 48, wherein the metal of said metal oxide comprises bismuth.

57. The method of claim 56, wherein the metal of said metal oxide further comprises tantalum.

58. The method of claim 57, wherein the metal of said metal oxide further comprises strontium.

59. The method of claim 48, wherein the metal of said metal oxide comprises titanium.

60. The method of claim 59, wherein the metal of said metal oxide further comprises barium.

61. The method of claim 60, wherein the metal of said metal oxide further comprises strontium.

62. The method of claim 48, wherein the amorphous paraelectric metal oxide thin film material comprises a material selected from the group consisting of barium titanate, strontium titanate, barium strontium titanate, strontium bismuth tantalate, bismuth titanate and lead zirconium titanate.

63. The method of claim 48, wherein the amorphous paraelectric metal oxide thin film material comprises an A-site ($ABO_3$) deficient material.

64. The method of claim 48, wherein the amorphous paraelectric metal oxide thin film material comprises PbO or $Bi_2O_3$ additions to an oxide of one or more metals selected from the group consisting of titanium, zirconium, hafnium, vanadium, niobium, tantalum, chromium, molybdenum and tungsten.

65. The method of claim 48, wherein the amorphous paraelectric metal oxide thin film material comprises an alloying component selected from the group consisting of La, Nb, Zr, Hf, W and Ba.

66. The method of claim 48, wherein the amorphous paraelectric metal oxide thin film material comprises $SrBi_2Ta_2O_9$.

67. The method of claim 48, wherein the amorphous paraelectric metal oxide thin film material comprises $Bi_4Ti_3O_{12}$.

68. The method of claim 48, wherein the amorphous paraelectric metal oxide thin film material comprises (Ba, Sr)$TiO_3$.

69. The method of claim 48, wherein the amorphous paraelectric metal oxide thin film material comprises a Ba—Sr—Ti-oxide.

70. The method of claim 48, wherein the amorphous paraelectric metal oxide thin film material comprises a Sr—Bi—Ta-oxide.

71. The method of claim 48, wherein said step of depositing on the first electrode a layer of amorphous paraelectric metal oxide thin film material is conducted at a temperature below 500° C.

72. The method of claim 48, wherein said step of depositing on the first electrode a layer of amorphous paraelectric metal oxide thin film material is conducted at a temperature below 400° C.

73. The method of claim 48, wherein said step of depositing on the first electrode a layer of amorphous paraelectric metal oxide thin film material comprises MOCVD.

74. The method of claim 48, wherein said step of depositing on the first electrode a layer of amorphous paraelectric metal oxide thin film material comprises liquid delivery MOCVD.

75. A method of forming a thin film capacitor structure on a substrate, comprising:

forming a first electrode on the substrate;

depositing on the first electrode a layer of amorphous paraelectric, metal oxide, dielectric, thin film material, said material, said material:
  (a) when formed as a paraelectric thin film by CVD, having properties comprising:
    (i) a voltage independent capacitance;
    (ii) a capacitance density of from about 1000 to about 10,000 $nF/cm^2$;
    (iii) a current leakage of <$10^{-7}$ $A/cm^2$; and
    (iv) a ratio of metal in the dielectric paraelectric thin film selected from the group consisting of:
      (I) 0 to 20% strontium, 5 to 70% bismuth and 10 to 95% tantalum;
      (II) 0 to 10% strontium, 5 to 55% bismuth and 35 to 95% tantalum; and
      (III) 0 to 5% strontium, 15 to 50% bismuth and 45 to 85% tantalum; and
  (b) a stoichiometric composition that is different from the stoichiometric composition of a bulk crystalline material of the same elements that is annealable to yield a bulk ferroelectric material; and forming a second electrode on the layer of amorphous paraelectric metal oxide thin film material.

76. A high k amorphous paraelectric metal oxide thin film material having a voltage independent capacitance, a capacitance density greater than 1000 $nF/cm^2$, and a current leakage of <$10^{-7}$ $A/cm^2$, wherein the high k amorphous paraelectric metal oxide thin film material has a composition selected from the group consisting of a stoichiometric composition that is different from the stoichiometric composition of a bulk crystalline material of the same elements that is annealable to yield a bulk ferroelectric material and a ferroelectric in both crystalline thin film and crystalline bulk forms.

77. A paraelectric amorphous metal oxide thin film dielectric material with a capacitance density greater than 1000 $nF/cm^2$, less than 0.5% change of capacitance in a range from 0 to 250 kV/cm bias, less than 10% change of capacitance in a range of temperature of from 298° K. to 77° K., an inverse capacitance that scales as a ratio of film thickness, and a current leakage of <$10^{-7}$ $A/cm^2$.

78. The material of claim 77, formed by a process wherein all processing is carried out at temperature less than 400° C.

\* \* \* \* \*